US011876093B2

(12) United States Patent
Huang et al.

(10) Patent No.: US 11,876,093 B2
(45) Date of Patent: Jan. 16, 2024

(54) POWER DEVICE INCLUDING LATERAL INSULATED GATE BIPOLAR TRANSISTOR (LIGBT) AND MANUFACTURING METHOD THEREOF

(71) Applicant: RICHTEK TECHNOLOGY CORPORATION, Zhubei (TW)

(72) Inventors: Chih-Feng Huang, Hsinchu (TW); Lung-Sheng Lin, Taichung (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 241 days.

(21) Appl. No.: 17/142,154

(22) Filed: Jan. 5, 2021

(65) Prior Publication Data

US 2021/0305242 A1 Sep. 30, 2021

Related U.S. Application Data

(60) Provisional application No. 62/993,757, filed on Mar. 24, 2020.

(30) Foreign Application Priority Data

May 27, 2020 (TW) .................................. 109117676

(51) Int. Cl.
| | |
|---|---|
| *H01L 27/07* | (2006.01) |
| *H01L 29/739* | (2006.01) |
| *H01L 29/66* | (2006.01) |
| *H01L 21/8249* | (2006.01) |
| *H01L 29/872* | (2006.01) |

(52) U.S. Cl.
CPC ...... *H01L 27/0722* (2013.01); *H01L 21/8249* (2013.01); *H01L 29/66136* (2013.01); *H01L 29/66143* (2013.01); *H01L 29/66325* (2013.01); *H01L 29/7393* (2013.01); *H01L 29/872* (2013.01)

(58) Field of Classification Search
None
See application file for complete search history.

(56) References Cited

U.S. PATENT DOCUMENTS

2010/0314681 A1* 12/2010 Hsieh ................ H01L 29/41766
  257/334
2012/0032313 A1* 2/2012 Yamamoto .......... H01L 27/0664
  257/657

(Continued)

*Primary Examiner* — Bilkis Jahan
(74) *Attorney, Agent, or Firm* — Tung & Associates

(57) ABSTRACT

A power device which is formed on a semiconductor substrate includes: plural lateral insulated gate bipolar transistors (LIGBTs) and a forward conductive unit. The plural LIGBTs are connected in parallel to each other. The forward conductive unit is connected in parallel to the plural LIGBTs. The forward conductive unit consists of a PN diode and a Schottky diode connected in parallel to each other. The PN diode and the Schottky diode share a same N-type region, a reverse terminal, an N-type extension region, an field oxide region, a gate, and a P-type well in an epitaxial layer. The N-type region and the P-type well form a PN junction, wherein the PN junction has a staggered combteeth interface from top view. A metal line extends on the staggered comb-teeth interface and alternatingly contacts the N-type region and the P-type well.

17 Claims, 21 Drawing Sheets

(56) References Cited

U.S. PATENT DOCUMENTS

| | | | | |
|---|---|---|---|---|
| 2012/0286829 A1* | 11/2012 | Yamji | ................... | H01L 27/088 |
| | | | | 327/109 |
| 2013/0069712 A1* | 3/2013 | Trajkovic | .......... | H01L 29/66325 |
| | | | | 257/E29.256 |
| 2013/0168730 A1* | 7/2013 | Ashida | ................ | H01L 29/0653 |
| | | | | 257/139 |
| 2015/0008481 A1* | 1/2015 | Pathirana | ............ | H01L 29/0834 |
| | | | | 257/140 |
| 2015/0084060 A1* | 3/2015 | Huang | ................ | H01L 29/1095 |
| | | | | 438/134 |
| 2017/0243937 A1* | 8/2017 | Ward | .................. | H01L 29/0619 |
| 2018/0308962 A1* | 10/2018 | Li | ....................... | H01L 29/7393 |

\* cited by examiner

POWER DEVICE INCLUDING LATERAL INSULATED GATE BIPOLAR TRANSISTOR (LIGBT) AND MANUFACTURING METHOD THEREOF

CROSS REFERENCE

The present invention claims priority to U.S. 62/993,757 filed on Mar. 24, 2020 and claims priority to TW 109117676 filed on May 27, 2020.

BACKGROUND OF THE INVENTION

Field of Invention

The present invention relates to a power device; particularly, it relates to a power device including lateral insulated gate bipolar transistor (LIGBTs). The present invention also relates to a manufacturing method of such a power device.

Description of Related Art

Please refer to FIGS. 1A and 1B, which respectively show a top view and a cross-section view of a conventional power device (i.e., power device 100) including lateral insulated gate bipolar transistors (LIGBTs). The power device 100 is configured to operably control a flywheel current of a flywheel motor; the flywheel current flows through the power device 100 to drive the flywheel motor. The flywheel motor controls a flywheel to store kinetic energy during rotation of the flywheel, which is well known to those skilled in the art, so the details thereof are not redundantly explained here. Generally, the power device 100 includes plural LIGBTs which are connected in parallel to each other and a PN diode. The PN diode and the LIGBTs are connected in parallel to each other. Due to the fact that the PN diode will generate a huge amount of reverse recovery charges (Qrr), the power device 100 has a slower switching speed, higher power consumption, lower power conversion efficiency as compared to a metal oxide semiconductor (MOS) power device.

As shown in FIGS. 1A and 1B, the power device 100 is formed on a semiconductor substrate 11. The power device 100 comprises: an LIGBT (LIGBT1) and an LIGBT (LIGBT2) which are connected in parallel to each other and a PN diode PN1. FIG. 1B is a cross sectional view of the power device 100 taken along A-A' line of FIG. 1A. The PN diode PN1 includes: a first field oxide region 121, a first N-type region 131, a first N-type extension region 141, a first P-type well 151, a first gate 161, a reverse terminal 171 and a forward terminal 181. The first N-type region 131, the first N-type extension region 141, the first P-type well 151, the reverse terminal 171 and the forward terminal 181 are formed in an epitaxial layer on a first insulation bottom layer 12. A first insulation structure ISO1 includes the first insulation bottom layer 12 and a first insulation side wall 123. The first insulation bottom layer 12 is formed on the semiconductor substrate 11 and in contact with the semiconductor substrate 11. The first insulation structure ISO1 is located under an upper surface of the epitaxial layer and encompasses the PN diode PN1 in a closed manner, so as to ensure that the PN diode PN1 under the upper surface of the epitaxial layer is electrically insulated from other devices.

The LIGBT (LIGBT1) and the LIGBT (LIGBT2) which are connected in parallel to each other are both formed on the semiconductor substrate 11 and have identical configuration. As shown in FIGS. 1A and 1B, the LIGBT (LIGBT2) includes: a second field oxide region 122, a second N-type region 132, a second N-type extension region 142, a second P-type well 152, a second gate 162, a drain 172, an emitter 182 and a P-type contact electrode 184. The second N-type region 132, the second N-type extension region 142, the second P-type well 152, the drain 172, the emitter 182 and the P-type contact electrode 184 are formed in the epitaxial layer on a second insulation bottom layer 12'. A second insulation structure ISO1 includes the second insulation bottom layer 12' and a second insulation side wall 124. The second insulation structure ISO2 is located under the upper surface of the epitaxial layer and encompasses the LIGBT (LIGBT1) and the LIGBT (LIGBT2) in a closed manner, so as to ensure that the LIGBT (LIGBT1) and the LIGBT (LIGBT2) under the upper surface of the epitaxial layer are electrically insulated from other devices. The LIGBT (LIGBT1) and the LIGBT (LIGBT2) have exactly identical configuration, and the LIGBT (LIGBT1) and the LIGBT (LIGBT2) are electrically connected in parallel to each other. As shown in FIG. 1A, a third insulation side wall 125 forms a closed surrounding side wall, which encloses the first insulation side wall 123 and the second insulation side wall 124 within the third insulation side wall 125. That is, the power device 100 is encompassed by the closed surrounding side wall formed by the third insulation side wall 125.

As described above, when a flywheel current of a flywheel motor is controlled by the power device 100, due to the fact that the PN diode will generate a huge amount of reverse recovery charges (Qrr), the power device 100 has a slower switching speed, higher power consumption, lower power conversion efficiency.

In view of above, to overcome the drawback in the prior art, the present invention provides a power device including lateral insulated gate bipolar transistor (LIGBTs) and a manufacturing method of such power device, which is capable of reducing unwanted Qrr, improving the switching speed of the power device 100, and reducing power consumption to enhance power conversion efficiency.

SUMMARY OF THE INVENTION

From one perspective, the present invention provides a power device, which is formed on a semiconductor substrate; the power device comprising: a plurality of lateral insulated gate bipolar transistors (LIGBTs) which are connected in parallel to each other; and a forward conductive unit, which is connected in parallel to the plurality of LIGBTs, wherein the forward conductive unit consists of a PN diode and a Schottky diode which are connected in parallel to each other; wherein the PN diode and the Schottky diode share a first N-type region, a reverse terminal, a first N-type extension region, a first field oxide region, a first gate and a first P-type well; wherein the first N-type region, the reverse terminal, the first N-type extension region and the first P-type well are formed in an epitaxial layer on or above the semiconductor substrate; wherein the first N-type region and the first P-type well form a PN junction therebetween, wherein the PN junction has a staggered comb-teeth interface from top view; wherein a metal line extends on the staggered comb-teeth interface and alternatingly contacts the first N-type region and the first P-type well.

From another perspective, the present invention provides a manufacturing method of a power device, wherein the power device is formed on a semiconductor substrate; the manufacturing method comprising: forming a plurality of lateral insulated gate bipolar transistors (LIGBTs) which are connected in parallel to each other; and forming a forward conductive unit, which is connected in parallel to the plurality of LIGBTs, wherein the forward conductive unit consists of a PN diode and a Schottky diode which are connected in parallel to each other; wherein the PN diode and the Schottky diode share a first N-type region, a reverse terminal, a first N-type extension region, a first field oxide region, a first gate and a first P-type well; wherein the first N-type region, the reverse terminal, the first N-type extension region and the first P-type well are formed in an epitaxial layer on or above the semiconductor substrate; wherein the first N-type region and the first P-type well form a PN junction therebetween, wherein the PN junction has a staggered comb-teeth interface from top view; wherein a metal line extends on the staggered comb-teeth interface and alternatingly contacts the first N-type region and the first P-type well.

In one embodiment, a drain of each LIGBT is electrically connected to a forward terminal of the forward conductive unit, whereas, an emitter of each LIGBT is electrically connected to the reverse terminal of the forward conductive unit.

In one embodiment, a bottom and a side of the forward conductive unit are encompassed by a first insulation structure, while, bottoms and sides of the plurality of LIGBTs are encompassed by a second insulation structure.

In one embodiment, each LIGBT includes: a second N-type region, which is formed in the epitaxial layer; a second P-type well, which is formed in the epitaxial layer; an N-type drain, which is formed in the second P-type well; a P-type contact electrode, which is formed in the second P-type well, wherein the P-type contact electrode serves as an electrical point of the second P-type well; a second gate, which is formed on the epitaxial layer, wherein a part of the second gate is connected on the second P-type well; a second N-type extension region, which is formed in the second N-type region, wherein the second N-type extension region and the second P-type well are separated from each other via the second N-type region; a P-type emitter, which is formed in the second N-type extension region; and a second field oxide region, which is formed on the epitaxial layer, wherein the second field oxide region is located between the emitter and the drain.

In one embodiment, the first N-type extension region and the second N-type extension region are formed simultaneously via a same lithography process step and a same ion implantation process step; the first P-type well and the second P-type well are formed simultaneously via a same lithography process step and a same ion implantation process step; the reverse terminal and the emitter are formed simultaneously via a same lithography process step and a same ion implantation process step; the first gate and the second gate are formed simultaneously via a same gate formation process; the first field oxide region and the second field oxide region are formed simultaneously via a same oxidation process step.

In one embodiment, the first gate extends on the staggered comb-teeth interface and alternatingly contacts the first N-type region and the first P-type well, wherein the first gate is arranged in parallel with the metal line and the first gate does not directly contact the metal line.

In one embodiment, the semiconductor substrate is entirely in contact with and covered by an insulation layer, wherein the epitaxial layer is formed on and in contact with the insulation layer, wherein a part of the insulation layer serves as a first insulation bottom layer of the first insulation structure, whereas, another part of the insulation layer serves as a second insulation bottom layer of the second insulation structure.

In one embodiment, the epitaxial layer has an N conductivity type, wherein a part of the epitaxial layer serves as the first N-type region, whereas, another part of the epitaxial layer serves as the second N-type region.

In one embodiment, the epitaxial layer has a P conductivity type, wherein the first N-type region and the second N-type region are formed simultaneously via a same lithography process step and a same ion implantation process step.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, while the shapes, thicknesses, and widths are not drawn in actual scale.

Figure 1A:
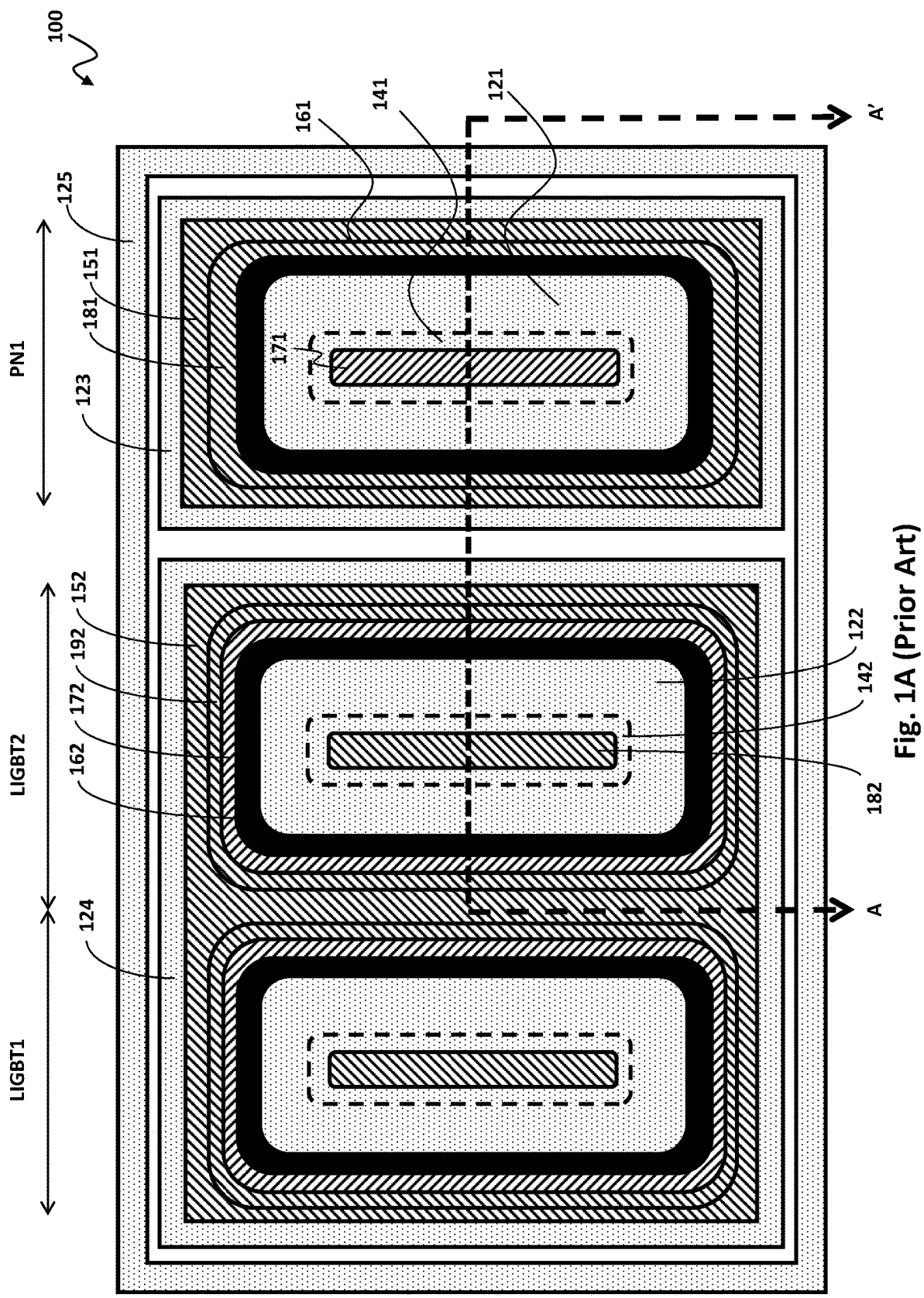
FIGS. 1A and 1B show a top view and a cross-section view of a conventional power device (i.e., power device 100) including lateral insulated gate bipolar transistors (LIGBTs), respectively.
Figure 1B:
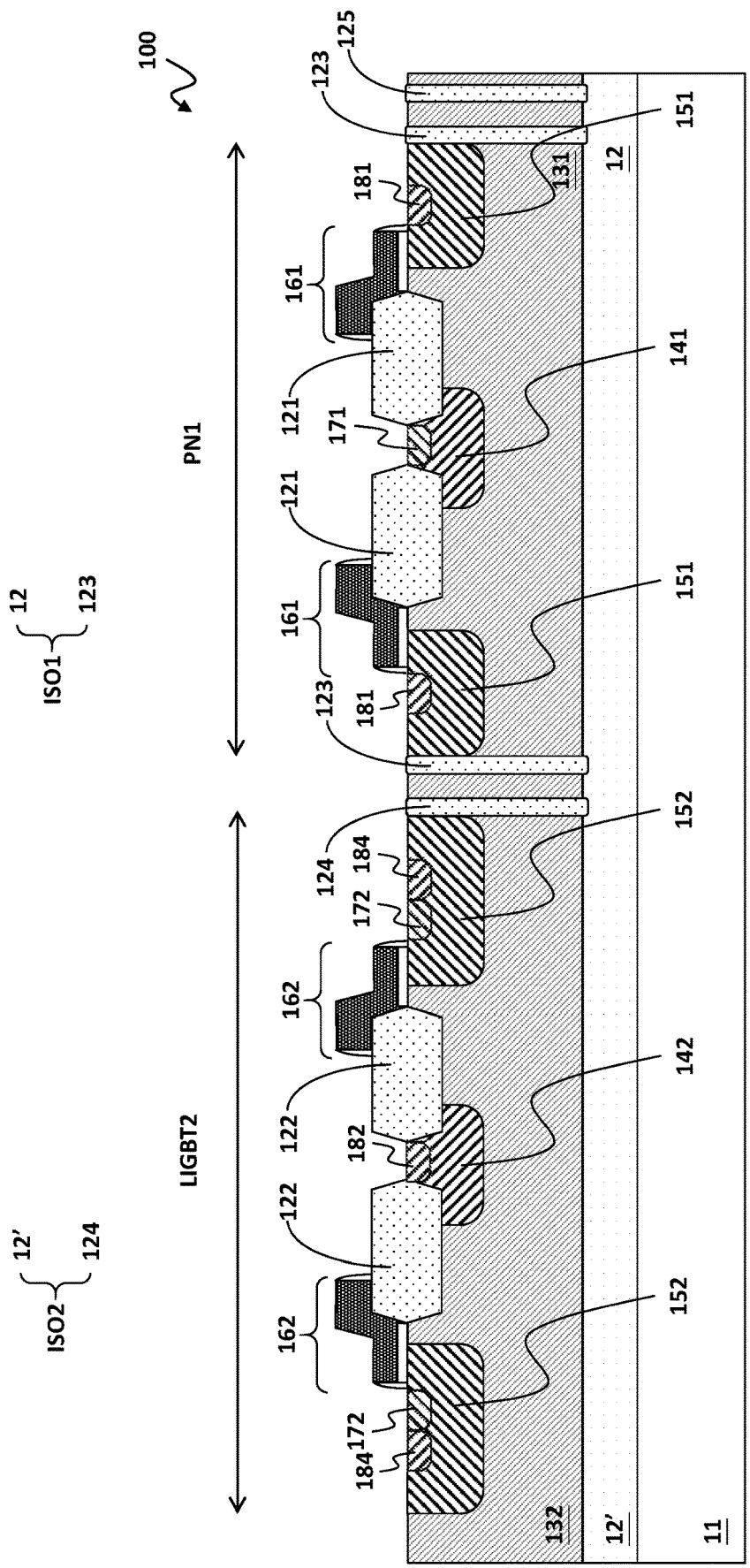
Figure 2A:
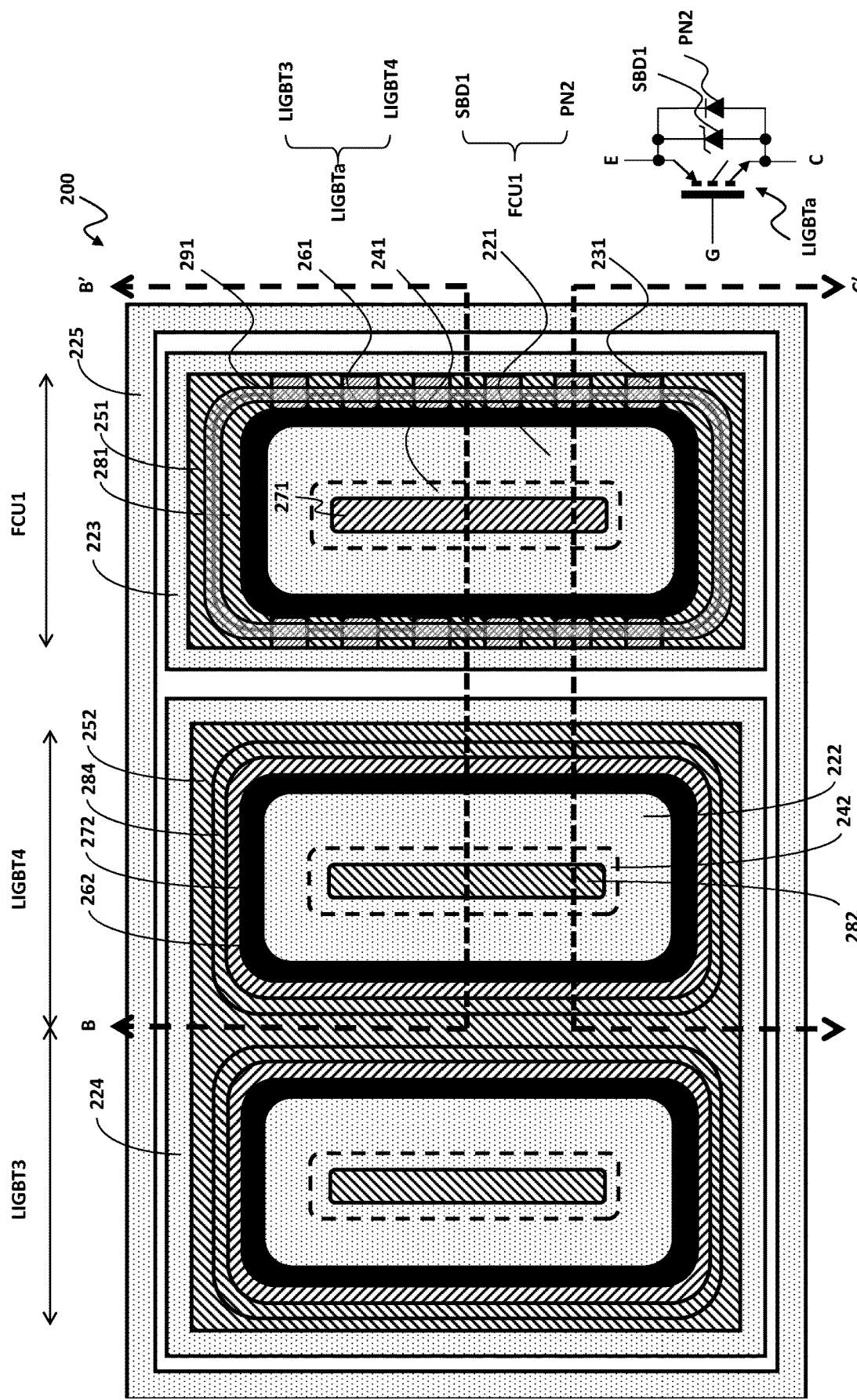
FIGS. 2A-2C show a power device according to an embodiment of the present invention.
Figure 2B:
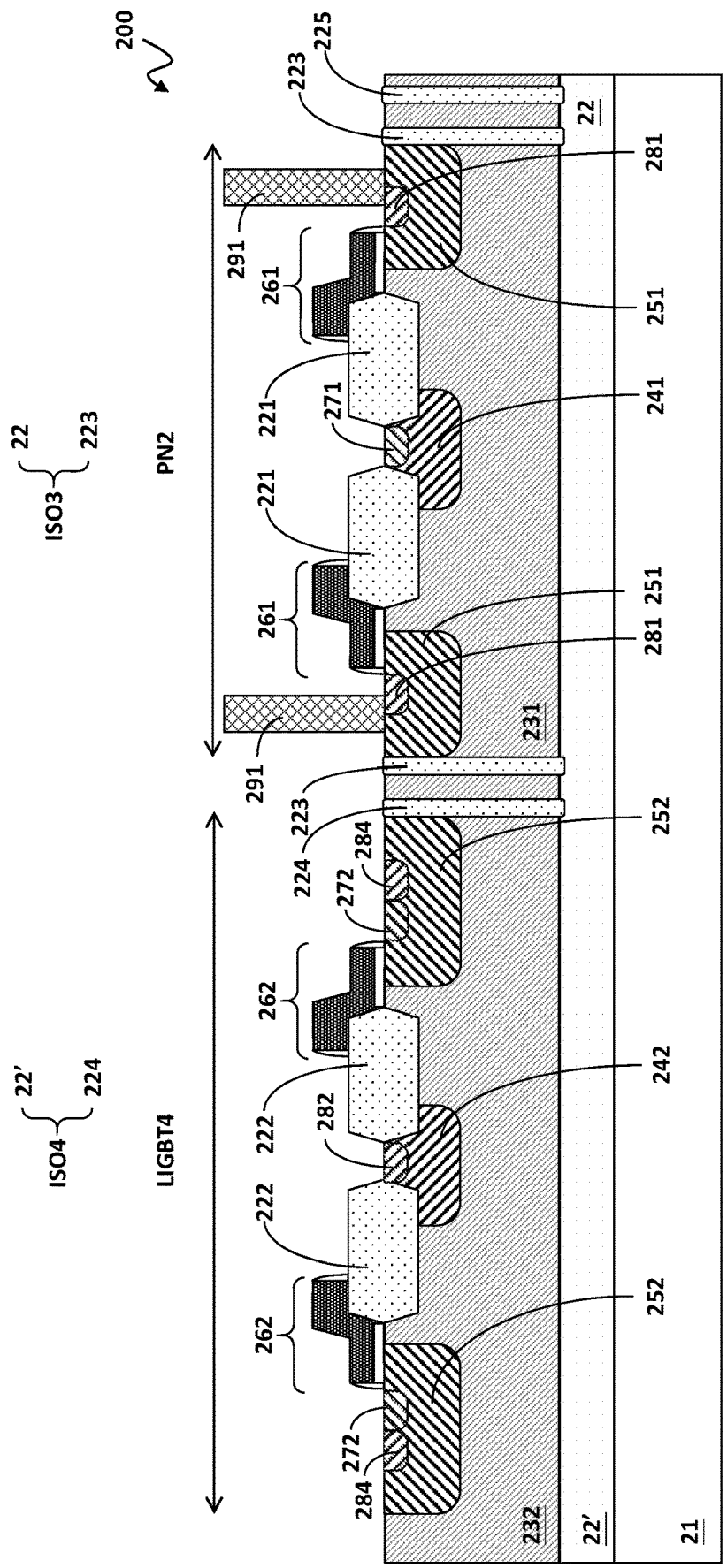
Figure 2C:
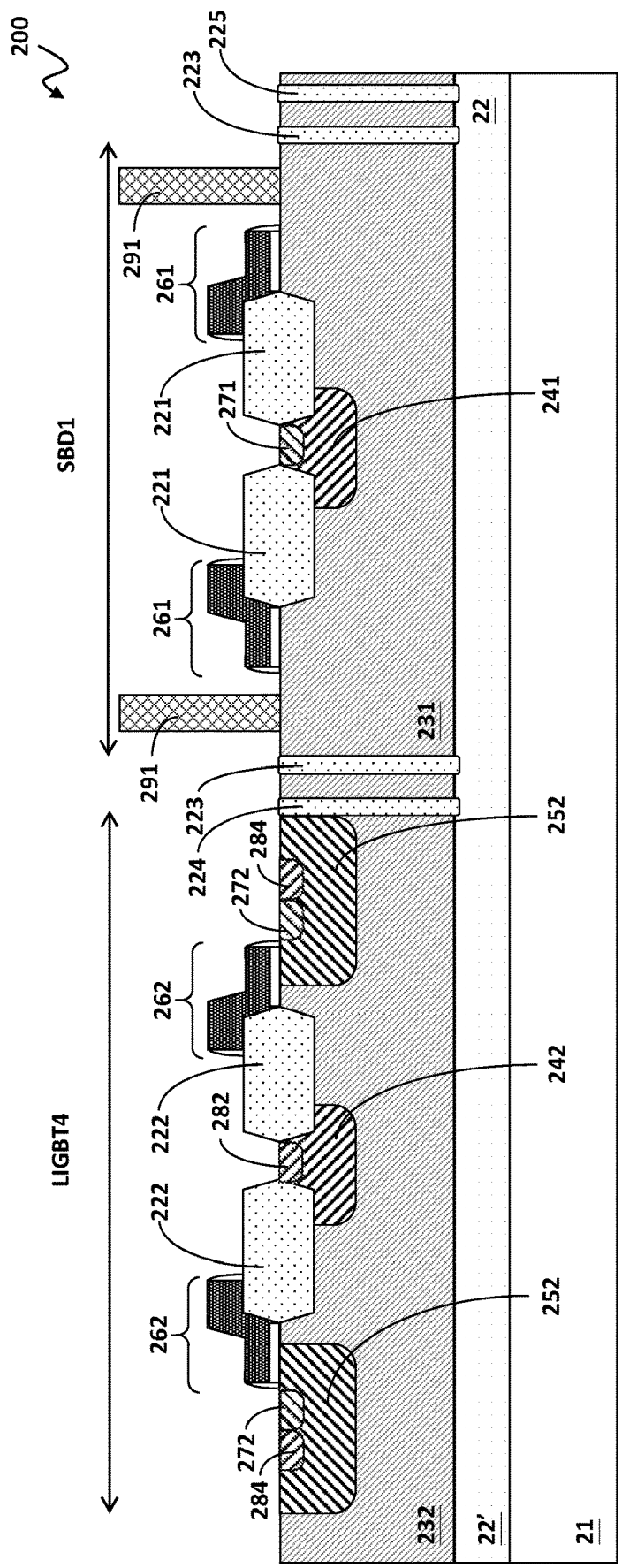

Please refer to FIGS. 2A-2C, which show a power device according to an embodiment of the present invention. As shown in FIGS. 2A-2C, the power device 200 is formed on a semiconductor substrate 21. The power device 200 comprises: an LIGBT (LIGBT3) and an LIGBT (LIGBT4) which are connected in parallel to each other and a forward conductive unit FCU1. FIG. 2B is a cross sectional view of the power device 200 taken along B-B' line of FIG. 2A, whereas, FIG. 2C is a cross sectional view of the power device 200 taken along C-C' line of FIG. 2A. The LIGBT (LIGBT3) and the LIGBT (LIGBT4) which are connected in parallel to each other constitute an LIGBT unit LIGBTa. The forward conductive unit FCU1 consists of a PN diode PN2 and a Schottky diode SBD1 which are connected in parallel to each other. In the power device 200, the LIGBT unit LIGBTa is coupled to the forward conductive unit FCU1 in a manner as illustrated by the small circuit diagram in FIG. 2A. The LIGBT unit LIGBTa has a gate G, an emitter E and a drain C. The forward conductive unit FCU1 has a forward terminal F and a reverse terminal R. The forward conductive unit FCU1 is connected in parallel to the parallel circuit of the LIGBT (LIGBT3) and the LIGBT (LIGBT4). The drain C of the LIGBT unit LIGBTa is electrically connected to the forward terminal F of the forward conductive unit FCU1, whereas, the emitter E of the LIGBT unit LIGBTa is electrically connected to the reverse terminal R of the forward conductive unit FCU1.

It should be understood that the implementation of the LIGBT unit LIGBTa to consist of two LIGBTs (LIGBT3 and LIGBT4) in the above-mentioned preferred embodiment is only an illustrative example, but not for limiting the scope of the present invention. In other embodiments, it is also practicable and within the scope of the present invention that the LIGBT unit LIGBTa can consist of three or more LIGBTs which are connected in parallel with one another. In other embodiments, it is also practicable and within the scope of the present invention that the number of the forward conductive unit can be plural. In one preferred embodiment, the number of the forward conductive units is less than the number of the LIGBTs.

The forward conductive unit FCU1 includes: a first field oxide region 221, a first N-type region 231, a first N-type extension region 241, a first P-type well 251, a first gate 261, a reverse terminal 271 and a forward terminal 281. A bottom and a side of the forward conductive unit FCU1 are encompassed by a first insulation structure ISO3. The first insulation structure ISO3 includes a first insulation bottom layer 22 and a first insulation side wall 223.

The PN diode PN2 and the Schottky diode SBD1 of the forward conductive unit FCU1 share the first N-type region 231, the reverse terminal 271, the first N-type extension region 241, the first field oxide region 221, the first gate 261 and the first P-type well 251. The first N-type region 231 and the first P-type well 251 form a PN junction therebetween from top view perpendicular to the substrate (referring to FIG. 3), wherein the PN junction has a staggered comb-teeth interface as shown by the black thick dashed line in FIG. 3. A metal line 291 extends on the staggered comb-teeth interface and alternatingly contacts the first N-type region 231 and the first P-type well 251.

The LIGBT (LIGBT3) and the LIGBT (LIGBT4) are connected in parallel to each other; they are both formed on the semiconductor substrate 21 and have identical configuration. As shown in FIGS. 2A-2C, the LIGBT (LIGBT4) includes: a second field oxide region 222, a second N-type region 232, a second N-type extension region 242, a second P-type well 252, a second gate 262, a drain 272, an emitter 282 and a P-type contact electrode 284. The bottoms and the sides of the LIGBT (LIGBT3) and the LIGBT (LIGBT4) are encompassed by a second insulation structure ISO4. The second insulation structure ISO4 includes a second insulation bottom layer 22' and a second insulation side wall 224. The LIGBT (LIGBT3) has an exactly identical configuration as the LIGBT (LIGBT4) has, and the LIGBT (LIGBT3) and the LIGBT (LIGBT4) are electrically connected in parallel to each other. That is, a second gate, a drain, an emitter and a P-type contact electrode of the LIGBT (LIGBT3) are electrically connected to the second gate 262, the drain 272, the emitter 282 and the P-type contact electrode 284 of the LIGBT (LIGBT4).

As described above, the drain C of the LIGBT unit LIGBTa is electrically connected to the forward terminal F of the forward conductive unit FCU1, and the emitter E of the LIGBT unit LIGBTa is electrically connected to the reverse terminal R of the forward conductive unit FCU1; in the semiconductor embodiment illustrated, this means that the drain 272 is electrically connected to the forward terminal 281, whereas, the emitter 282 is electrically connected to the reverse terminal 271. The electrical connection for example can be achieved by forming a metal contact point and a metal conductive line, which is well known to those skilled in the art, so the details thereof are not redundantly explained here.

As shown in FIG. 2A, a third insulation side wall 225 forms a closed surrounding side wall, which encloses the first insulation side wall 223 and the second insulation side wall 224 within the third insulation side wall 225. That is, the power device 200 is encompassed by the closed surrounding side wall formed by the third insulation side wall 225. The emitters of the LIGBTs (LIGBT3 and LIGBT4) are electrically connected to the forward terminal 281 of the forward conductive unit FCU1, whereas, the drains of the LIGBTs LIGBT3 and LIGBT4 are electrically connected to the reverse terminal 271 of the forward conductive unit FCU1.

The first insulation bottom layer 22 and the second insulation bottom layer 22' are formed on the semiconductor substrate 21. The semiconductor substrate 21 can be, for example but not limited to, a P-type or an N-type semiconductor silicon substrate, or any other semiconductor substrate. For example, a silicon dioxide layer can be formed on the semiconductor substrate 21, wherein a part of the silicon dioxide layer can serve as the first insulation bottom layer 22, while, another part of the silicon dioxide layer can serve as the second insulation bottom layer 22'. An N-type epitaxial layer for example can be formed on the silicon dioxide layer (that is, the epitaxial layer is on or above the semiconductor substrate 21), wherein apart of the N-type epitaxial layer can serve as the first N-type region 231, while, another part of the N-type epitaxial layer can serve as the second N-type region 232. The above-mentioned semiconductor substrate 21, silicon dioxide layer and N-type epitaxial layer can be implemented through adopting an silicon on insulator (SOI) wafer, which is well known to those skilled in the art, so the details thereof are not redundantly explained here.

The first insulation side wall 223, the second insulation side wall 224 and the third insulation side wall 225 for example can be formed by: simultaneously forming respective deep trenches via a same deep trench etching process step; and simultaneously depositing an insulation material such as silicon dioxide into the above-mentioned deep trenches by a same deposition process step. In addition, the first insulation side wall 223, the second insulation side wall 224 and the third insulation side wall 225 are in contact with the underneath silicon dioxide layer which is on and in contact with the semiconductor substrate 21, so that the first insulation side wall 223, the second insulation side wall 224 and the third insulation side wall 225 can respectively form a closed region in the epitaxial layer. In one embodiment, a bottom and a side of the forward conductive unit FCU1 are encompassed by a first insulation structure ISO3, whereas, the bottoms and the sides of the LIGBT (LIGBT3) and the LIGBT (LIGBT4) are encompassed by a second insulation structure ISO4.

Please still refer to FIGS. 2A-2C. The first N-type extension region 241 and the second N-type extension region 242 are formed in the epitaxial layer on or above the semiconductor substrate 21. The second N-type extension region 242 is formed in the second N-type region 232. The second N-type extension region 242 and the second P-type well 252 are separated from each other by the second N-type region 232. The first N-type extension region 241 and the second N-type extension region 242 can be formed by, for example but not limited to, simultaneously defining the regions of the first N-type extension region 241 and the second N-type extension region 242 via a same lithography process step, and simultaneously implanting N-type impurities in the regions defined by the above-mentioned lithography process step in the form of accelerated ions via a same ion implantation process step, to form the first N-type extension region 241 and the second N-type extension region 242. The first N-type extension region 241 and the second N-type extension region 242 are both formed in the above-mentioned N-type epitaxial layer, both under and in contact with the upper surface of the N-type epitaxial layer.

The first field oxide region 221 and the second field oxide region 222 can be simultaneously formed on and in contact with the upper surface of the N-type epitaxial layer via, for example but not limited to, a same oxidation process step. The first field oxide region 221 and the second field oxide region 222 are not limited to the local oxidation of silicon (LOCOS) structure as shown in FIG. 2B and FIG. 2C; for example, it may be a shallow trench isolation (STI) structure instead. As shown in FIG. 2A, the first field oxide region 221 and the second field oxide region 222 each has a closed surrounding configuration from top view; the first field oxide region 221 and the second field oxide region 222 encompass a part of the first N-type extension region 241 and a part of the second N-type extension region 242, respectively. The first field oxide region 221 is located between the forward terminal 281 and the reverse terminal 271, whereas, the second field oxide region 222 is located between the emitter 282 and the drain 272.

The first P-type well 251 and the second P-type well 252 can be formed by, for example but not limited to, simultaneously defining the regions of the first P-type well 251 and the second P-type well 252 via a same lithography process step, and simultaneously implanting P-type impurities in the regions defined by the above-mentioned lithography process step in the form of accelerated ions via a same ion implantation process step, to form the first P-type well 251 and the second P-type well 252. The first P-type well 251 and the second P-type well 252 are both formed in the above-mentioned N-type epitaxial layer, both under and in contact with the upper surface of the N-type epitaxial layer. As shown in FIG. 2A, the first P-type well 251 and the second P-type well 252 each has a closed surrounding configuration from top view; the first P-type well 251 and the second P-type well 252 encompass a part of the first field oxide region 221 and a part of the second field oxide region 222, respectively. As shown in the top view of FIG. 2A (please refer also to the top view of FIG. 3), a side of the first P-type well 251 has a comb-teeth edge. Such comb-teeth edge at the side of the first P-type well 251 and the corresponding complementary comb-teeth edge at the side of the first N-type region 231 together form a PN junction having a staggered comb-teeth interface (as shown by the black thick dashed line in FIG. 3). FIG. 2B is a cross sectional view of the power device 200 taken along B-B' line of FIG. 2A, wherein the B-B' line passes through the first P-type well 251, while FIG. 2C is a cross sectional view of the power device 200 taken along C-C' line of FIG. 2A, wherein the C-C' line does not pass through the first P-type well 251.

As shown in FIG. 2A, the first gate 261 and the second gate 262 each has a closed surrounding configuration from top view. According to the top view of FIG. 2A, the first gate 261 is formed on and in contact with a part of the first field oxide region 221, and the first gate 261 surrounds another part of the first field oxide region 221. According to the top view of FIG. 2A, the second gate 262 is formed on and in contact with a part of the second field oxide region 222 and the second gate 262 surrounds another part of the second field oxide region 222.

The first gate 261 and the second gate 262 can be simultaneously formed on the epitaxial layer via, for example but not limited to, a same gate formation process. A part of the first gate 261 is connected on the first P-type well 251, whereas, a part of the second gate 262 is connected on the second P-type well 252. Another part of the first gate 261 is connected on the first field oxide region 221, whereas, another part of the second gate 262 is connected on the second field oxide region 222. In one embodiment, the first gate 261 and the second gate 262 respectively include for example their own respective dielectric layers, conductive layers and spacer layers, which is well known to those skilled in the art, so the details thereof are not redundantly explained here. The above-mentioned gate formation process for example comprises: a lithography process step and an oxidation process step for forming the dielectric layer, a lithography process step and a deposition process step for forming the conductive layer, and a deposition process step and an etching process step for forming the spacer layer.

In this embodiment, the first gate 261 extends on the staggered comb-teeth interface and alternatingly contacts the first N-type region 231 and the first P-type well 251. The first gate 261 is arranged in parallel with the metal line 291 and the first gate 261 does not directly contact the metal line 291.

The forward terminal 281, the emitter 282 and the P-type contact electrode 284 can be formed by, for example but not limited to, simultaneously defining the regions of the forward terminal 281, the emitter 282 and the P-type contact electrode 284 via a same lithography process step, and simultaneously implanting P-type impurities in the regions defined by the above-mentioned lithography process step in the form of accelerated ions via a same ion implantation process step, to form the forward terminal 281, the emitter 282 and the P-type contact electrode 284. The forward terminal 281, the emitter 282 and the P-type contact electrode 284 have P conductivity type. The forward terminal 281, the emitter 282 and the P-type contact electrode 284 are formed in the first P-type well 251, the second N-type extension region 242 and the second P-type well 252, respectively. The forward terminal 281, the emitter 282 and the P-type contact electrode 284 are under and in contact with the upper surface of the N-type epitaxial layer. As shown in FIG. 2A, the forward terminal 281 and the P-type contact electrode 284 have a closed surrounding configuration from top view, which encompass the first gate 261 and the drain 272, respectively. The P-type contact electrode 284 serves as an electrical point of the second P-type well 252.

The reverse terminal 271 and the drain 272 can be formed by, for example but not limited to, simultaneously defining the regions of the reverse terminal 271 and the drain 272 via a same lithography process step, and simultaneously implanting N-type impurities in the regions defined by the above-mentioned lithography process step in the form of accelerated ions via a same ion implantation process step, to form the reverse terminal 271 in the first N-type extension region 241 and form the drain 272 in the second N-type extension region 242. The reverse terminal 271 and the drain 272 have N conductivity type. The reverse terminal 271 and the drain 272 are both formed in the above-mentioned N-type epitaxial layer, and are both under and in contact with the upper surface of the N-type epitaxial layer. As shown in FIG. 2A, the drain 272 has a closed surrounding configuration from top view, which encompasses the second gate 262.

The present invention is advantageous over the prior art in that, taking this embodiment as an example: First the Schottky diode SBD1 is connected in parallel to the PN diode PN2, and the parallel circuit of the Schottky diode SBD1 and the PN diode PN2 is connected in parallel to the LIGBTs; thus, when the power device 200 operates, the unwanted reverse recovery charges (Qrr) can be reduced and the switching speed of the power device 200 can be enhanced, to reduce power consumption and improve power conversion efficiency. Second, the Schottky diode SBD1 and the PN diode PN2 can share the N-type region, the reverse terminal, the N-type extension region, the field oxide region, the gate and the P-type well; as a result, the desired performance is achieved without increasing the area of the power device 200. Third, it is required for the power device 200 to withstand a high voltage of several hundred volts; in this embodiment, the first N-type region 231 of the Schottky diode SBD1 is arranged to be adjacently connected to the first P-type well 251 of the PN diode PN2, so when a reverse-bias voltage is applied to the Schottky diode SBD1, the first P-type well 251 can cause the first N-type region 231 of the Schottky diode SBD1 to be completely depleted, so that the Schottky diode SBD1 is pinched off, thus reducing the leakage current of the Schottky diode SBD1.

Figure 3:
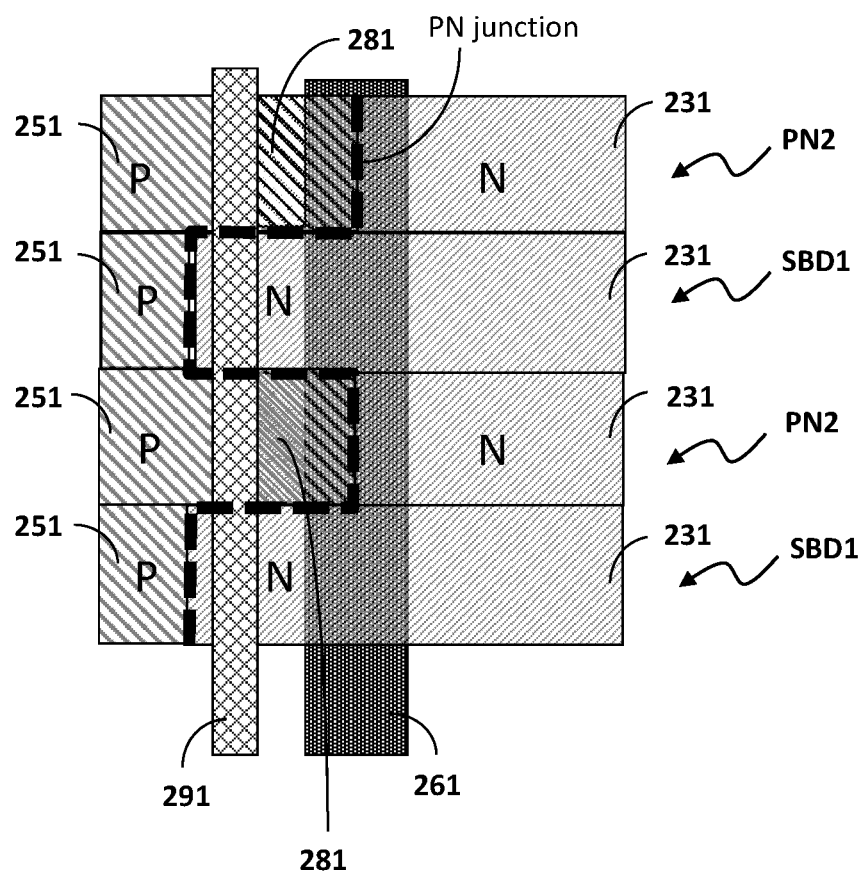
FIG. 3 shows a top view of an embodiment of the present invention, which illustrates that the PN junction has a staggered comb-teeth interface, wherein a metal line 291 extends on the staggered comb-teeth interface and alternatingly contacts the first N-type region 231 and the first P-type well 251.

Please refer to FIG. 3, which shows a top view of an embodiment of the present invention. The top view illustrates that the PN junction has a staggered comb-teeth interface, and a metal line 291 extends on the staggered comb-teeth interface to alternatingly contact the first N-type region 231 and the first P-type well 251. The metal line 291 and the first N-type region 231 forms a Schottky contact, whereas, the metal line 291 and the first P-type well 251 forms an Ohmic contact. In this embodiment, the first gate 261 extends on the staggered comb-teeth interface and alternatingly contacts the first N-type region 231 and the first P-type well 251, wherein the first gate 261 is arranged in parallel with the metal line 291 and the first gate 261 does not directly contact the metal line 291.

Figure 4A:
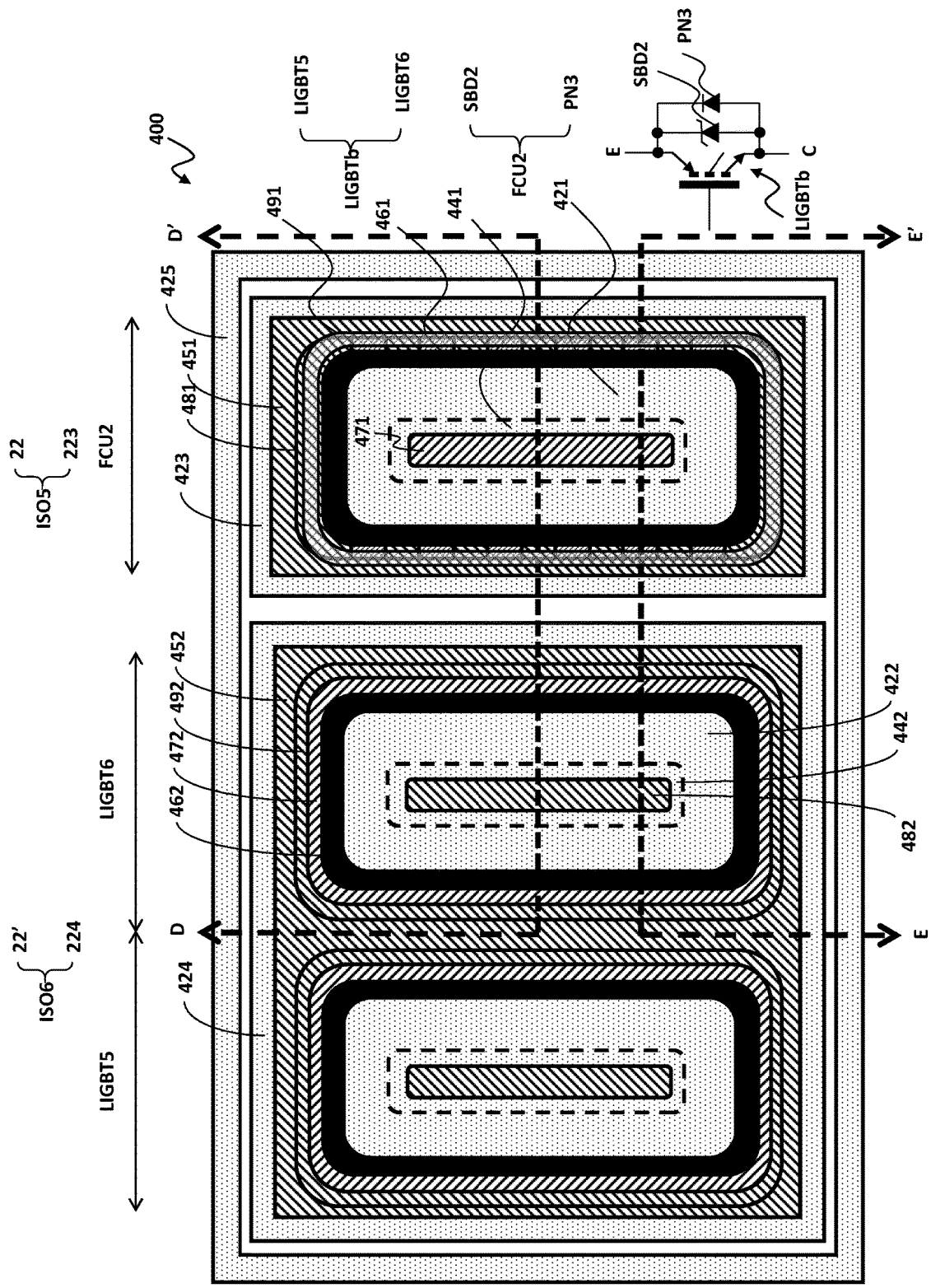
FIGS. 4A-4C show a power device according to another embodiment of the present invention.
Figure 4B:
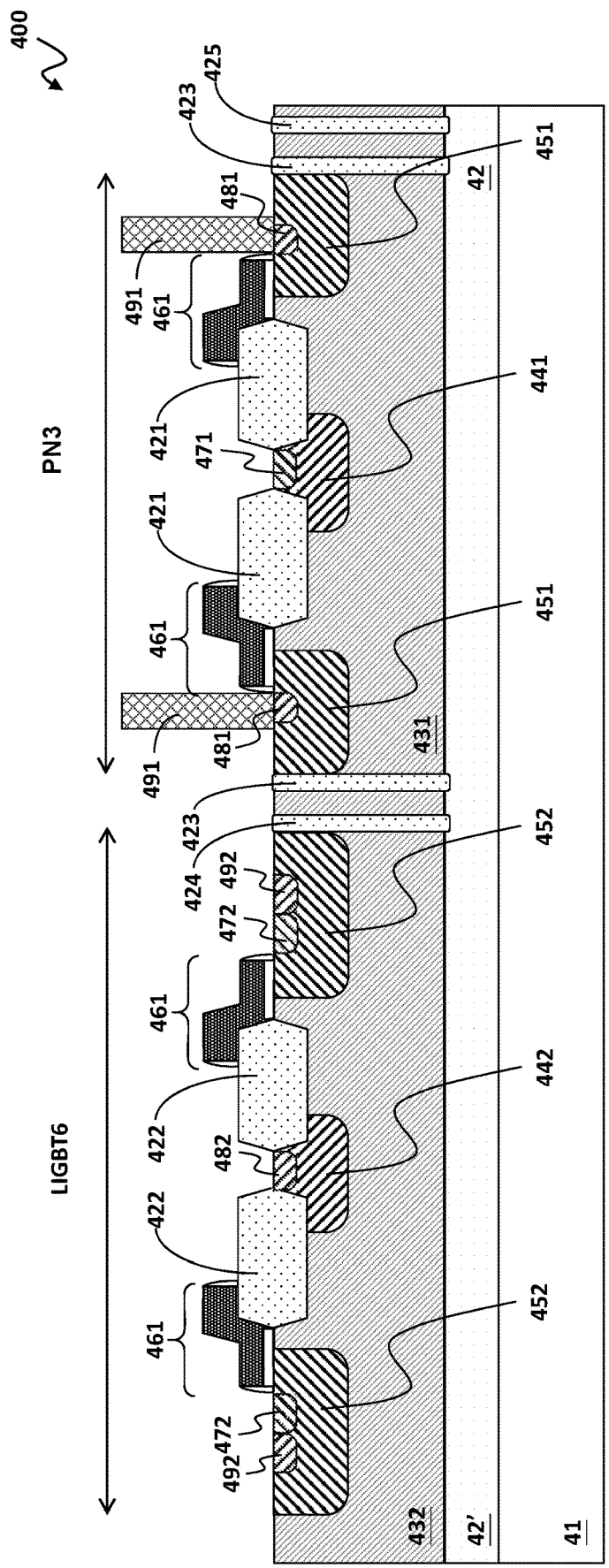
Figure 4C:
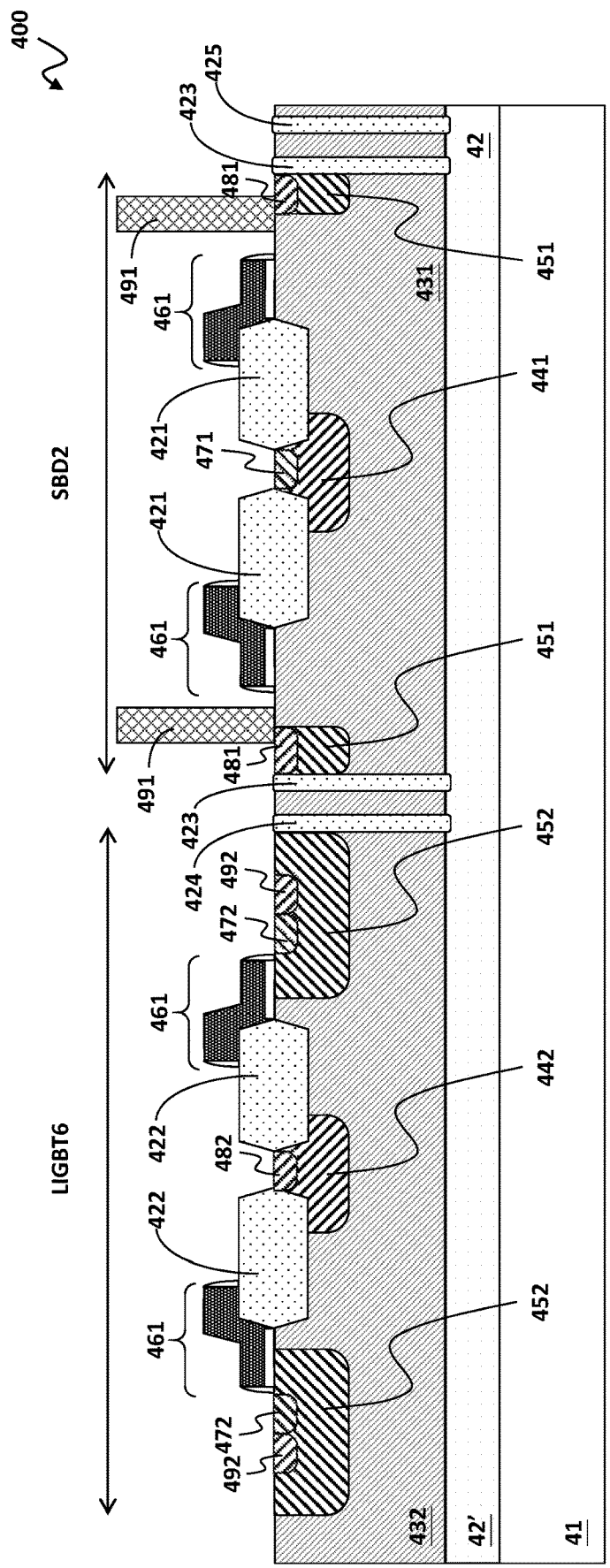

Please refer to FIGS. 4A-4C, which show a power device according to another embodiment of the present invention. As shown in FIGS. 4A-4C, the power device 400 is formed on a semiconductor substrate 41. The power device 400 comprises: an LIGBT (LIGBT5) and an LIGBT (LIGBT6) which are connected in parallel to each other and a forward conductive unit FCU2. FIG. 4B is a cross sectional view of the power device 400 taken along D-D' line of FIG. 4A, whereas, FIG. 4C is a cross sectional view of the power device 400 taken along E-E' line of FIG. 4A. The LIGBT (LIGBT5) and the LIGBT (LIGBT6) which are connected in parallel to each other constitute an LIGBT unit LIGBTb. The forward conductive unit FCU2 consists of a PN diode PN3 and a Schottky diode SBD2 which are connected in parallel to each other. In the power device 400, the LIGBT unit LIGBTb is coupled to the forward conductive unit FCU2 in a manner as illustrated by the small circuit diagram in FIG. 4A. The LIGBT unit LIGBTb has a gate G, an emitter E and a drain C. The forward conductive unit FCU2 has a forward terminal F and a reverse terminal R. The forward conductive unit FCU2 is connected in parallel to the parallel circuit of the LIGBT (LIGBT5) and the LIGBT (LIGBT6). The drain C of the LIGBT unit LIGBTb is electrically connected to the forward terminal F of the forward conductive unit FCU2, whereas, the emitter E of the LIGBT unit LIGBTb is electrically connected to the reverse terminal R of the forward conductive unit FCU2.

The forward conductive unit FCU2 includes: a first field oxide region 421, a first N-type region 431, a first N-type extension region 441, a first P-type well 451, a first gate 461, a reverse terminal 471 and a forward terminal 481. A bottom and a side of the forward conductive unit FCU2 are encompassed by a first insulation structure ISO5. The first insulation structure ISO5 includes a first insulation bottom layer 42 and a first insulation side wall 423.

The PN diode PN3 and the Schottky diode SBD2 of the forward conductive unit FCU2 share the first N-type region 431, the reverse terminal 471, the first N-type extension region 441, the first field oxide region 421, the first gate 461 and the first P-type well 451. The first N-type region 431 and the first P-type well 451 form a PN junction therebetween, wherein the PN junction has a staggered comb-teeth interface from top view. A metal line 491 extends on the staggered comb-teeth interface and alternatingly contacts the first N-type region 431 and the first P-type well 451.

The LIGBT (LIGBT5) and the LIGBT (LIGBT6) which are connected in parallel to each other are both formed on the semiconductor substrate 41 and have identical configuration. As shown in FIGS. 4A-4C, the LIGBT (LIGBT6) includes: a second field oxide region 422, a second N-type region 432, a second N-type extension region 442, a second P-type well 452, a second gate 462, a drain 472, an emitter 482 and a P-type contact electrode 484. The bottoms and the sides of the LIGBT (LIGBT5) and the LIGBT (LIGBT6) are encompassed by a second insulation structure ISO6. The second insulation structure ISO6 includes a second insulation bottom layer 42' and a second insulation side wall 424. The LIGBT (LIGBT5) has an exactly identical configuration as the LIGBT (LIGBT6). The LIGBT (LIGBT5) and the LIGBT (LIGBT6) are electrically connected in parallel to each other; that is, a second gate, a drain, an emitter and a P-type contact electrode of the LIGBT (LIGBT5) are electrically connected to the second gate 462, the drain 472, the emitter 482 and the P-type contact electrode 484 of the LIGBT (LIGBT6).

As described above, the drain C of the LIGBT unit LIGBTb is electrically connected to the forward terminal F of the forward conductive unit FCU2, and the emitter E of the LIGBT unit LIGBTb is electrically connected to the reverse terminal R of the forward conductive unit FCU2; in the semiconductor embodiment illustrated, this means that the drain 472 is electrically connected to the forward terminal 481, whereas, the emitter 482 is electrically connected to the reverse terminal 471.

As shown in FIG. 4A, a third insulation side wall 425 forms a closed surrounding side wall to enclose the first insulation side wall 423 and the second insulation side wall 424 within the third insulation side wall 425. That is, the power device 400 are encompassed by the closed surrounding side wall formed by the third insulation side wall 425.

This embodiment of FIGS. 4A-4C is different from the embodiment of FIGS. 2A-2C in that: as shown in FIGS. 4A and 4C, in this embodiment, the metal line 491 is in contact with the forward terminal 481 in the Schottky diode SBD2. In this embodiment, besides arranging the first N-type region 431 of the Schottky diode SBD2 to be adjacently connected to the first P-type well 451 of the PN diode PN3, the first P-type well 451 is also provided in the Schottky diode SBD2, so that the first P-type well 451 is adjacently connected to the first N-type region 431 at two sides of the first N-type region 431. As a result, when a reverse-bias voltage is applied to the Schottky diode SBD2, the Schottky diode SBD2 can be completely depleted even faster, so that the Schottky diode SBD2 is pinched off to reduce the leakage current of the Schottky diode SBD2.

Figure 5A:
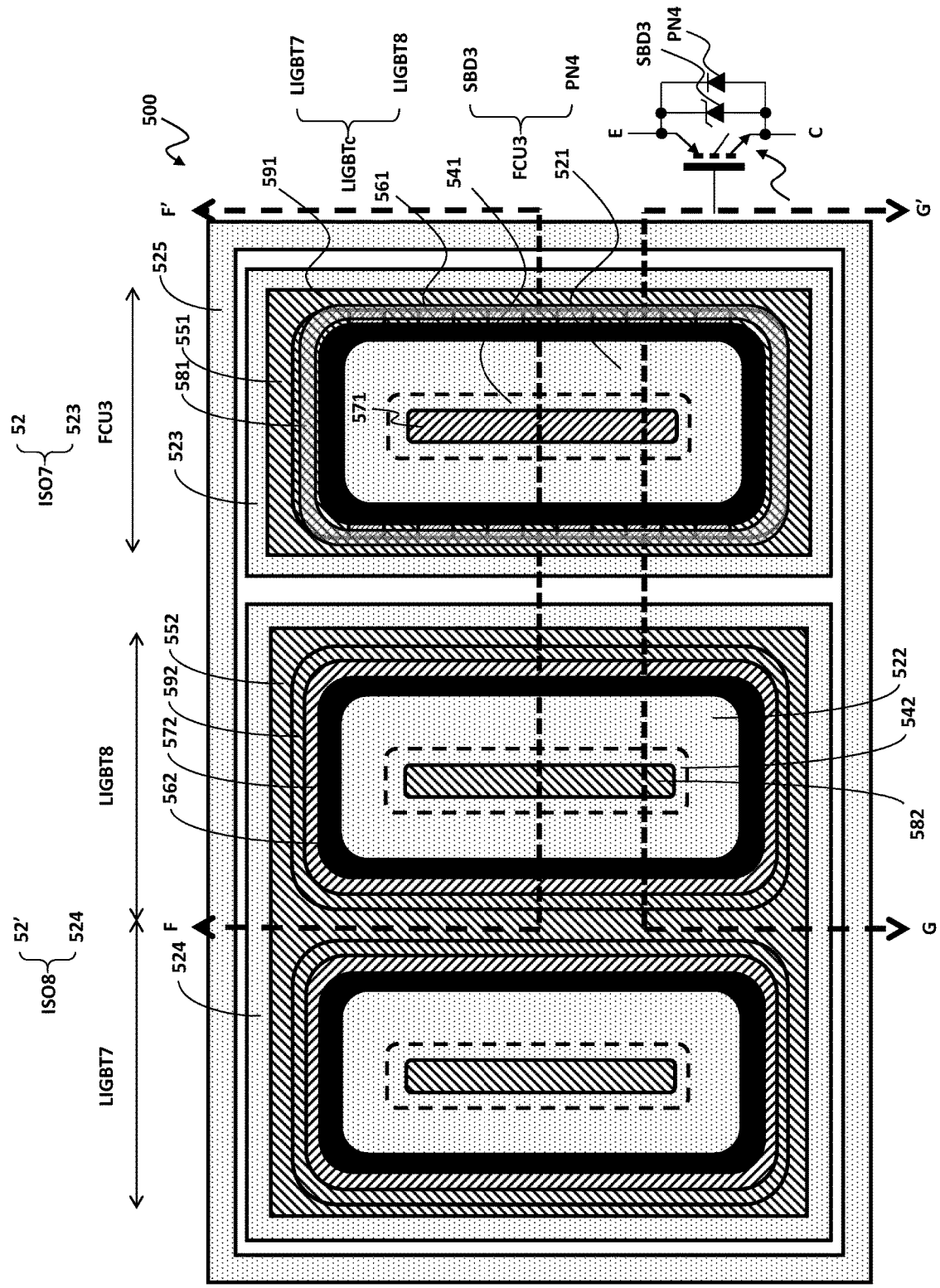
FIGS. 5A-5C show a power device according to yet another embodiment of the present invention.
Figure 5B:
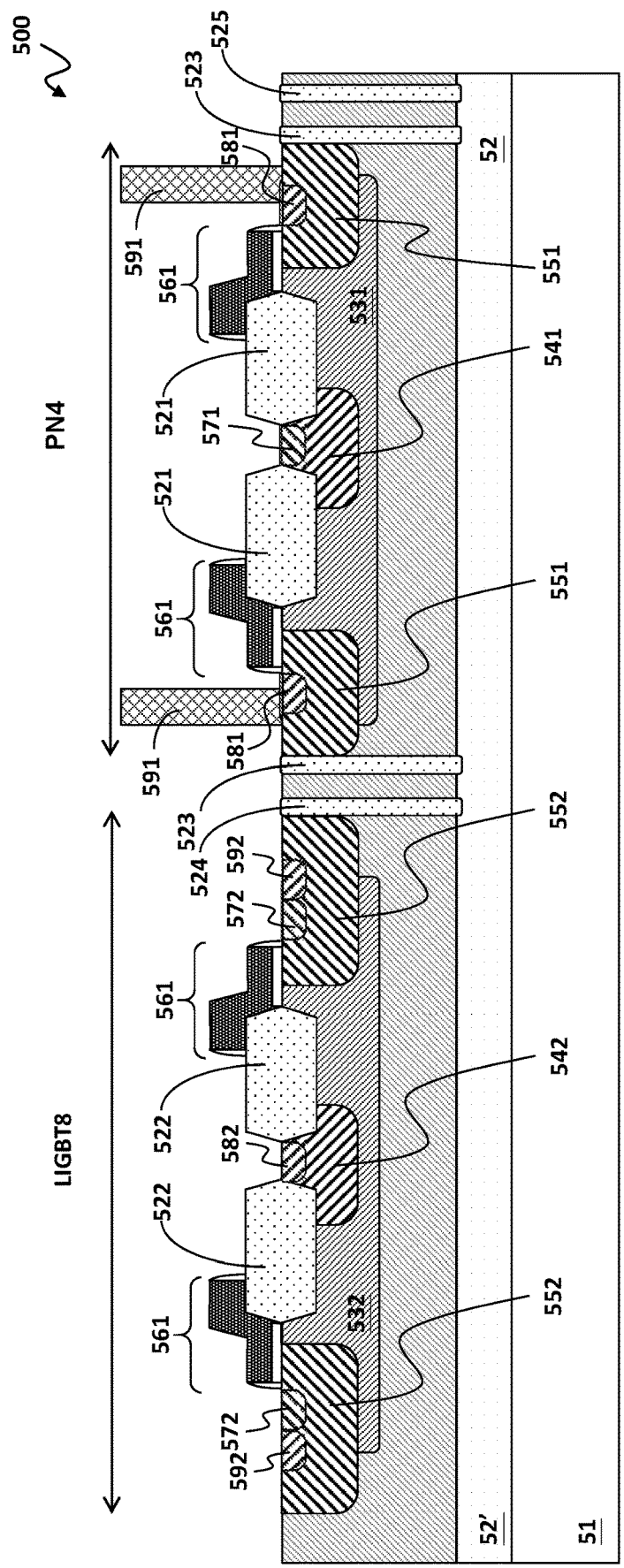
Figure 5C:
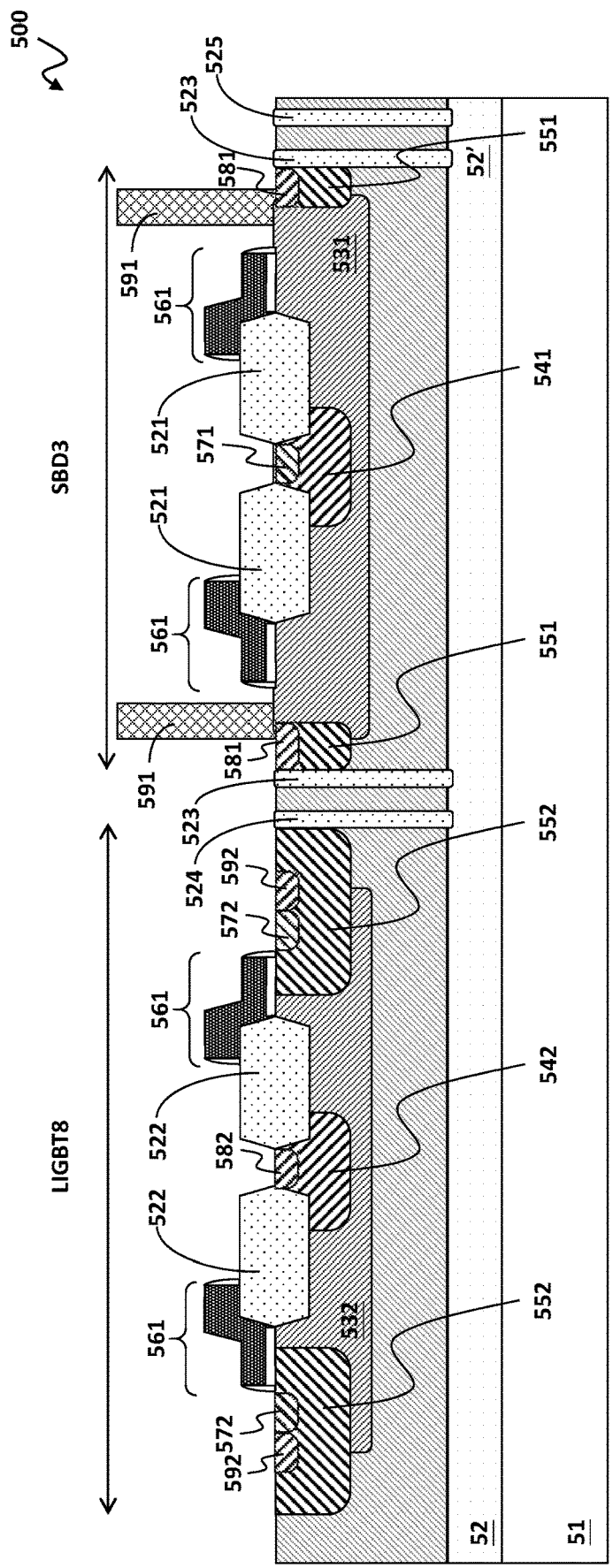

Please refer to FIGS. 5A-5C, which show a power device according to yet another embodiment of the present invention. As shown in FIGS. 5A-5C, the power device 500 is formed on a semiconductor substrate 51. The power device 500 comprises: an LIGBT (LIGBT7) and an LIGBT (LIGBT8) which are connected in parallel to each other and a forward conductive unit FCU3. FIG. 5B is a cross sectional view of the power device 500 taken along F-F' line of FIG. 5A, whereas, FIG. 5C is a cross sectional view of the power device 500 taken along G-G' line of FIG. 5A. The LIGBT (LIGBT7) and the LIGBT (LIGBT8) which are connected in parallel to each other constitute an LIGBT unit LIGBTc. The forward conductive unit FCU3 consists of a PN diode PN4 and a Schottky diode SBD3 which are connected in parallel to each other. In the power device 500, the LIGBT unit LIGBTc is coupled to the forward conductive unit FCU3 in a manner as illustrated by the small circuit diagram in FIG. 5A. The LIGBT unit LIGBTc has a gate G, an emitter E and a drain C. The forward conductive unit FCU3 has a forward terminal F and a reverse terminal R. The forward conductive unit FCU3 is connected in parallel to the parallel circuit of the LIGBT (LIGBT7) and the LIGBT (LIGBT8). The drain C of the LIGBT unit LIGBTc is electrically connected to the forward terminal F of the forward conductive unit FCU3, whereas, the emitter E of the LIGBT unit LIGBTc is electrically connected to the reverse terminal R of the forward conductive unit FCU3.

The forward conductive unit FCU3 includes: a first field oxide region 521, a first N-type region 531, a first N-type extension region 541, a first P-type well 551, a first gate 561, a reverse terminal 571 and a forward terminal 581. A bottom and a side of the forward conductive unit FCU3 are encompassed by a first insulation structure ISO7. The first insulation structure ISO7 includes a first insulation bottom layer 52 and a first insulation side wall 523.

The PN diode PN4 and the Schottky diode SBD3 of the forward conductive unit FCU3 share the first N-type region 531, the reverse terminal 571, the first N-type extension region 541, the first field oxide region 521, the first gate 561 and the first P-type well 551. The first N-type region 531 and the first P-type well 551 form a PN junction therebetween, wherein the PN junction has a staggered comb-teeth interface from top view. A metal line 591 extends on the staggered comb-teeth interface and alternatingly contacts the first N-type region 531 and the first P-type well 551.

The LIGBT (LIGBT7) and the LIGBT (LIGBT8) which are connected in parallel to each other are both formed on the semiconductor substrate 51 and have identical configuration. As shown in FIGS. 5A-5C, the LIGBT (LIGBT8) includes: a second field oxide region 522, a second N-type region 532, a second N-type extension region 542, a second P-type well 552, a second gate 562, a drain 572, an emitter 582 and a P-type contact electrode 584. The bottoms and the sides of the LIGBT (LIGBT7) and the LIGBT (LIGBT8) are encompassed by a second insulation structure ISO8. The second insulation structure ISO8 includes a second insulation bottom layer 52' and a second insulation side wall 524. The LIGBT (LIGBT7) has an exactly identical configuration as the LIGBT (LIGBT8). The LIGBT (LIGBT7) and the LIGBT (LIGBT8) are electrically connected in parallel to each other; that is, a second gate, a drain, an emitter and a P-type contact electrode of the LIGBT (LIGBT7) are electrically connected to the second gate 562, the drain 572, the emitter 582 and the P-type contact electrode 584 of the LIGBT (LIGBT8).

As described above, the drain C of the LIGBT unit LIGBTc is electrically connected to the forward terminal F of the forward conductive unit FCU3 and the emitter E of the LIGBT unit LIGBTc is electrically connected to the reverse terminal R of the forward conductive unit FCU3; in the semiconductor embodiment illustrated, this means that the drain 572 is electrically connected to the forward terminal 581, whereas, the emitter 582 is electrically connected to the reverse terminal 571.

As shown in FIG. 5A, a third insulation side wall 525 forms a closed surrounding side wall, which encloses the first insulation side wall 523 and the second insulation side wall 524 within the third insulation side wall 525. That is, the power device 500 are encompassed by the closed surrounding side wall formed by the third insulation side wall 525.

This embodiment of FIGS. 5A-5C is different from the embodiment of FIGS. 4A-4C in that: as shown in FIGS. 5B and 5C, in this embodiment, a silicon dioxide layer is formed on the semiconductor substrate 51. Under such situation, a part of the silicon dioxide layer can serve as the first insulation bottom layer 52, while, another part of the silicon dioxide layer can serve as the second insulation bottom layer 52'. On the silicon dioxide layer, for example, a P-type epitaxial layer instead of an N-type epitaxial layer is formed. The first N-type region 531 and the second N-type region 532 can be simultaneously formed by, for example but not limited to, defining the first N-type region 531 and the second N-type region 532 via a same lithography process step, and implanting N-type impurities in the regions defined by the above-mentioned lithography process step in the form of accelerated ions via a same ion implantation process step, to form the first N-type region 531 and the second N-type region 532.

Figure 6A:
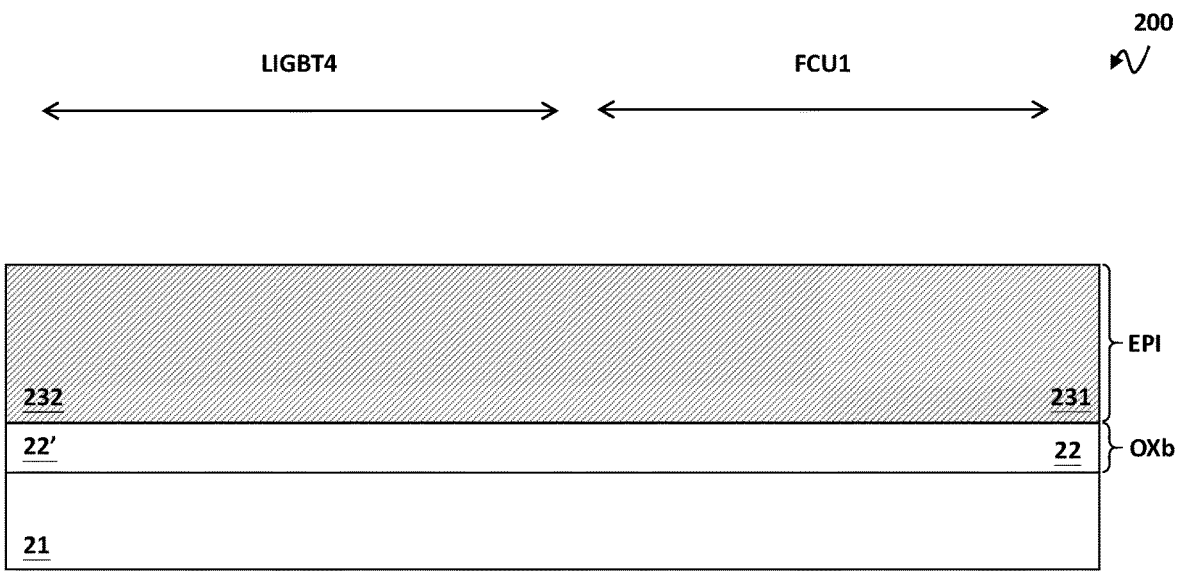
FIGS. 6A-6R show a manufacturing method of a power device according to an embodiment of the present invention.
Figure 6B:
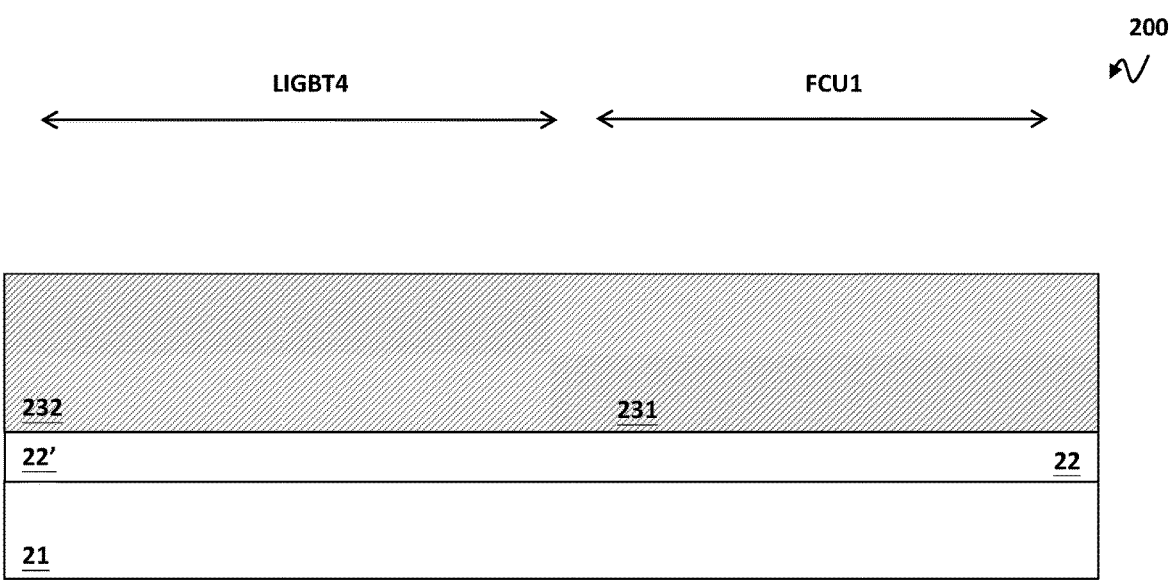
Figure 6C:
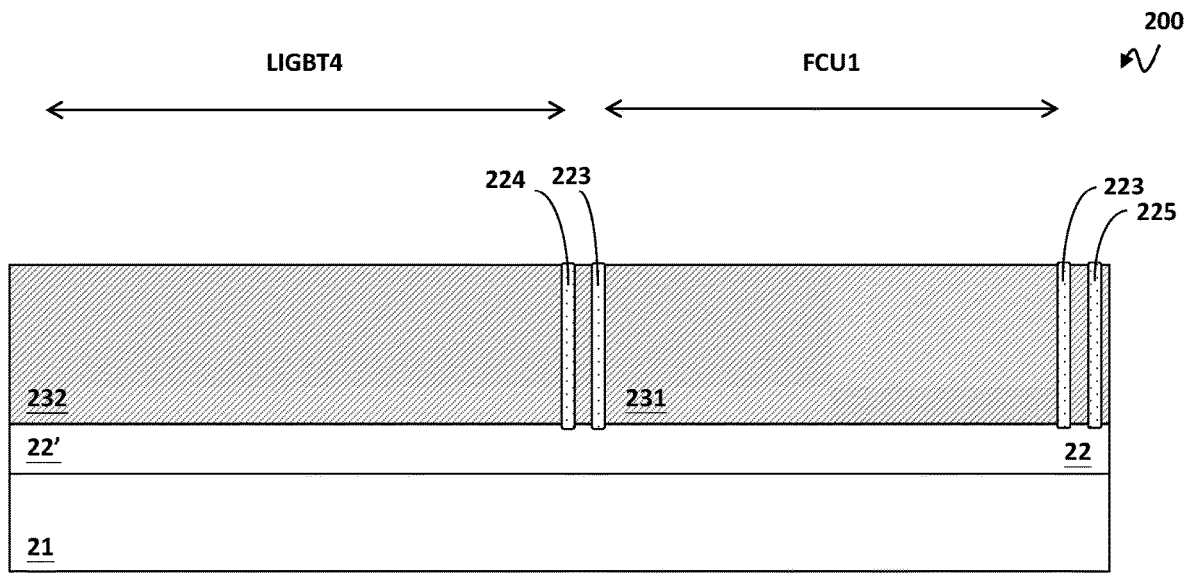
Figure 6D:
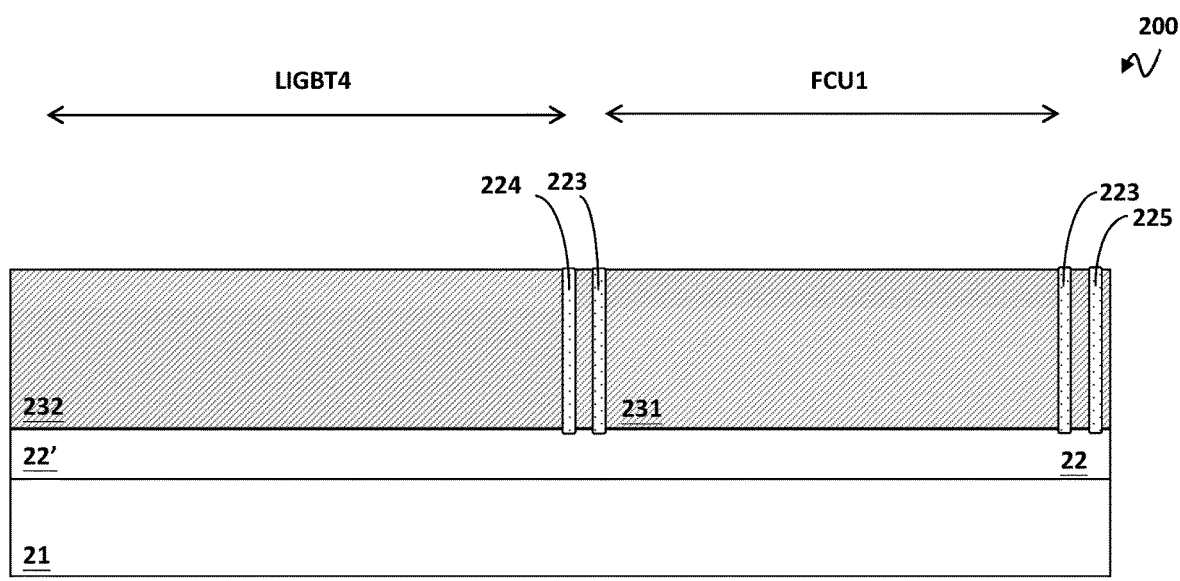
Figure 6E:
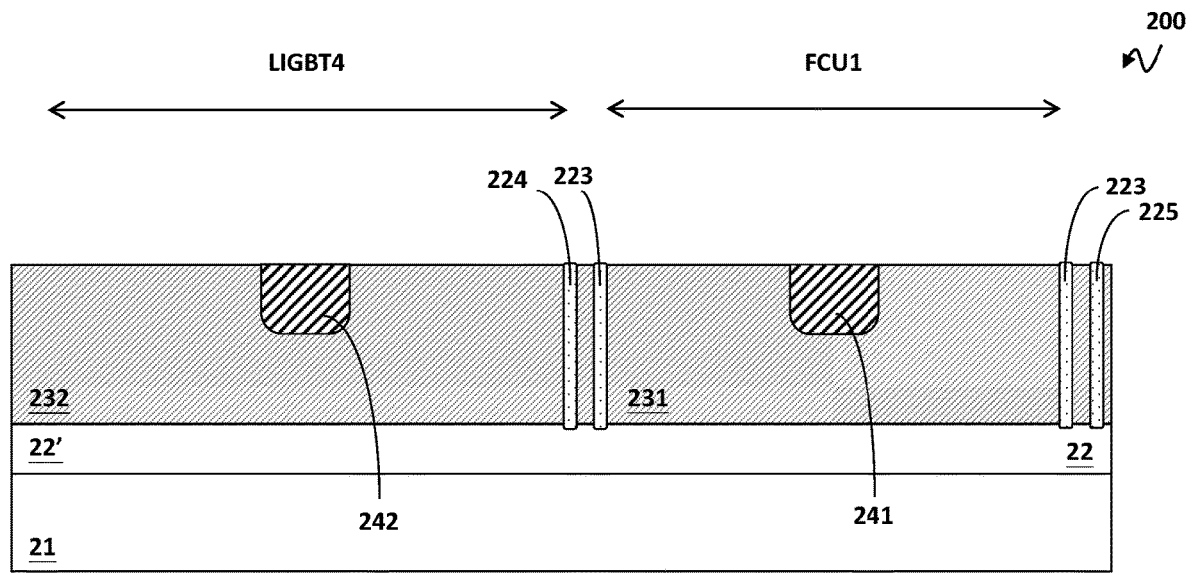
Figure 6F:
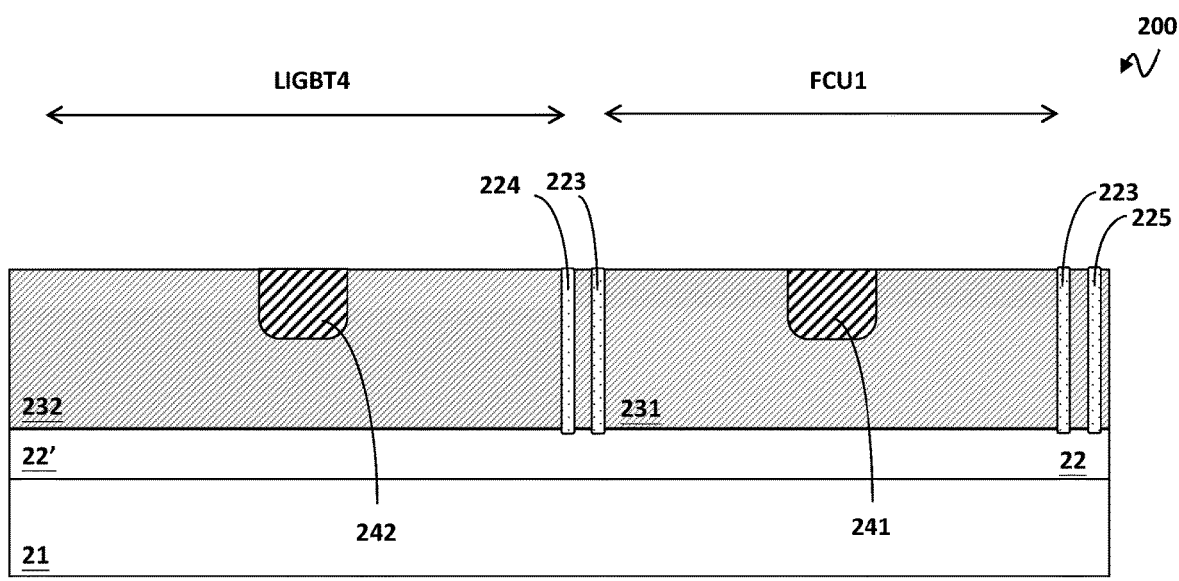
Figure 6G:
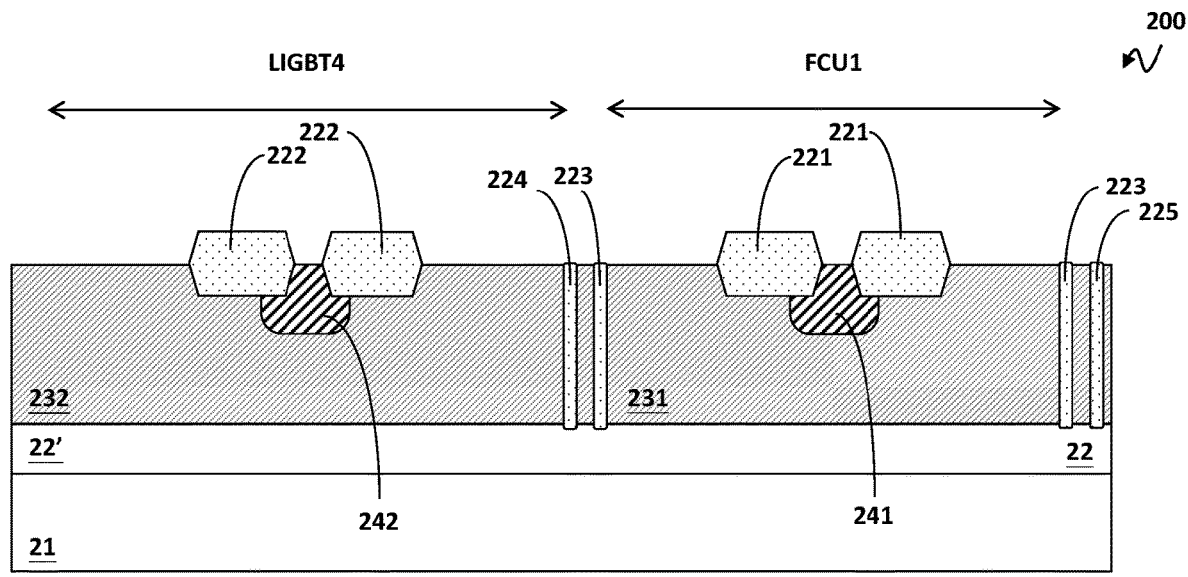
Figure 6H:
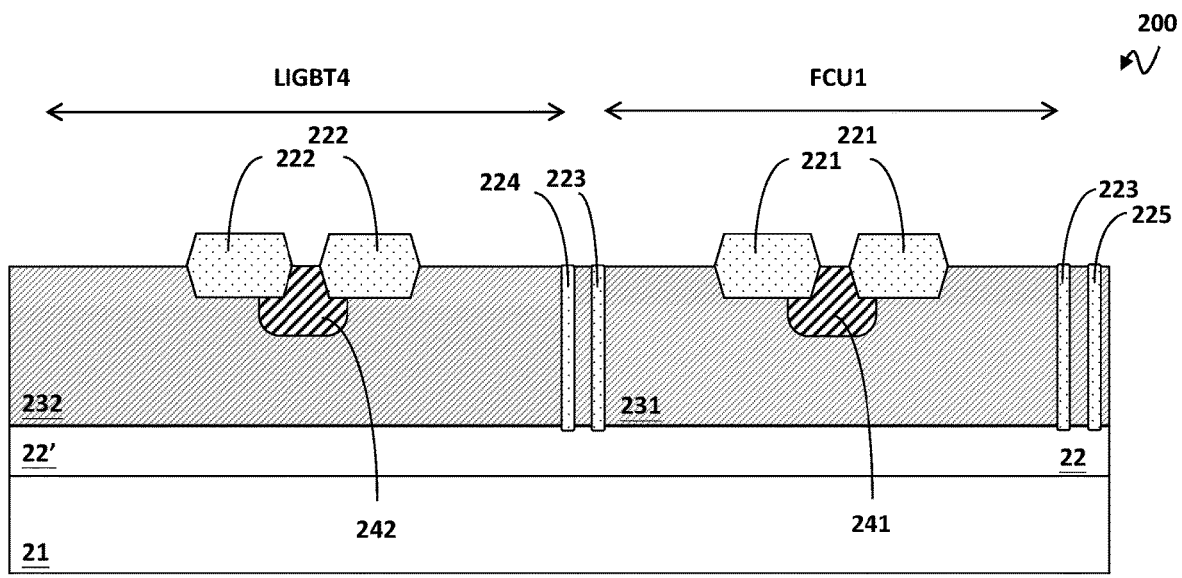
Figure 6I:
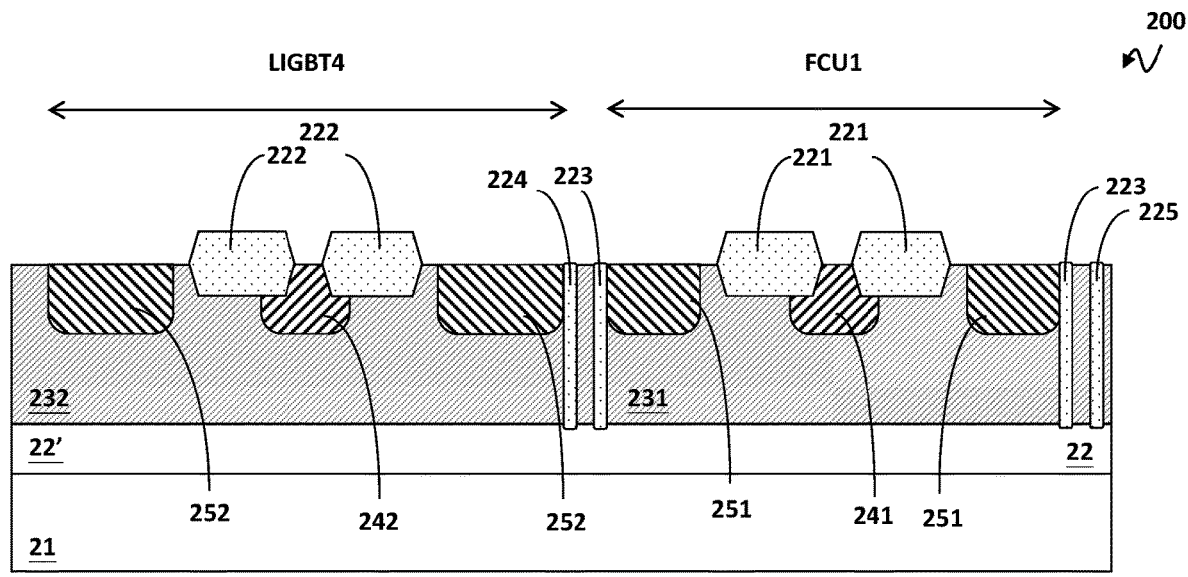
Figure 6J:
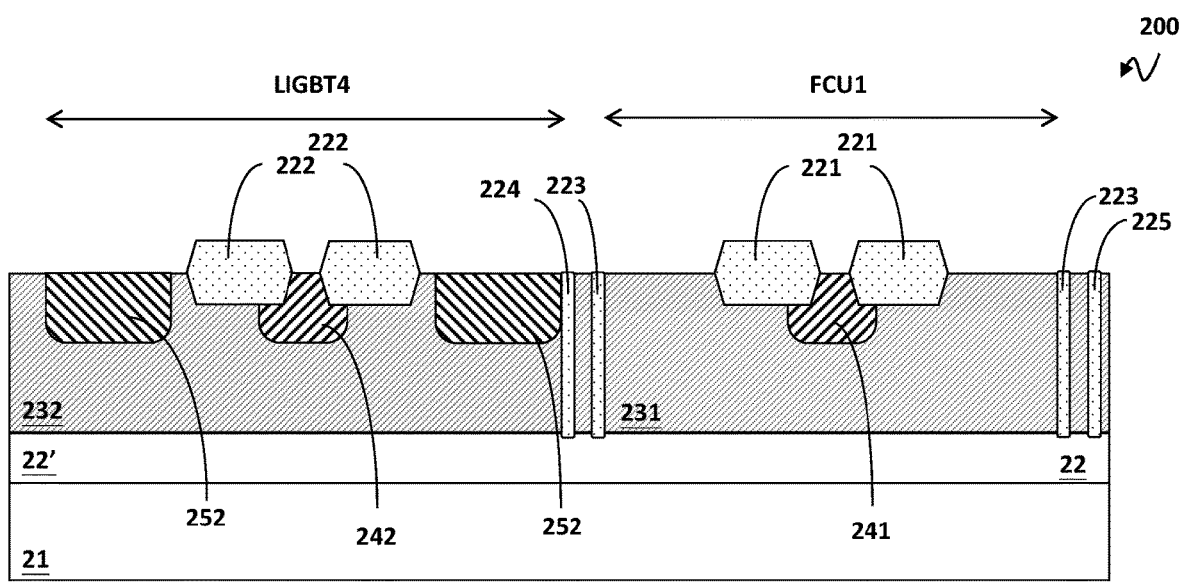
Figure 6K:
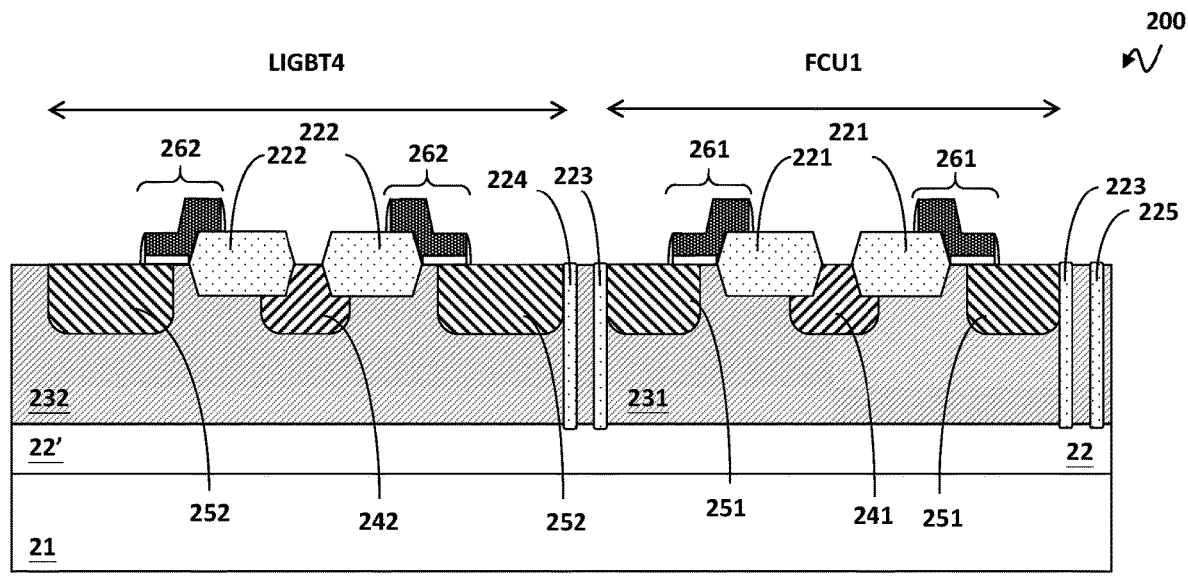
Figure 6L:
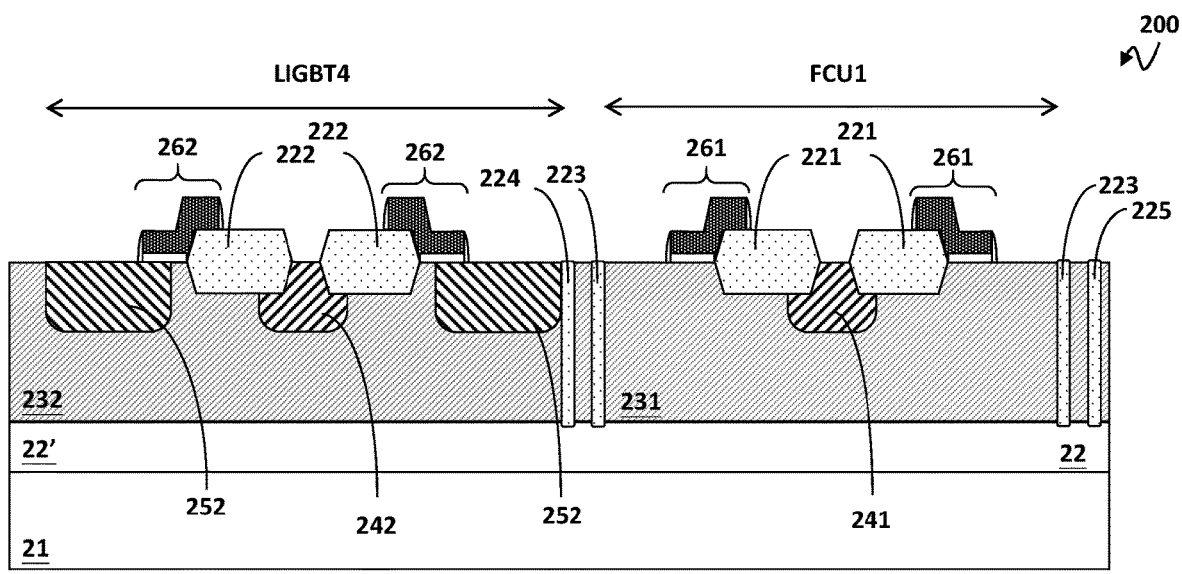
Figure 6M:
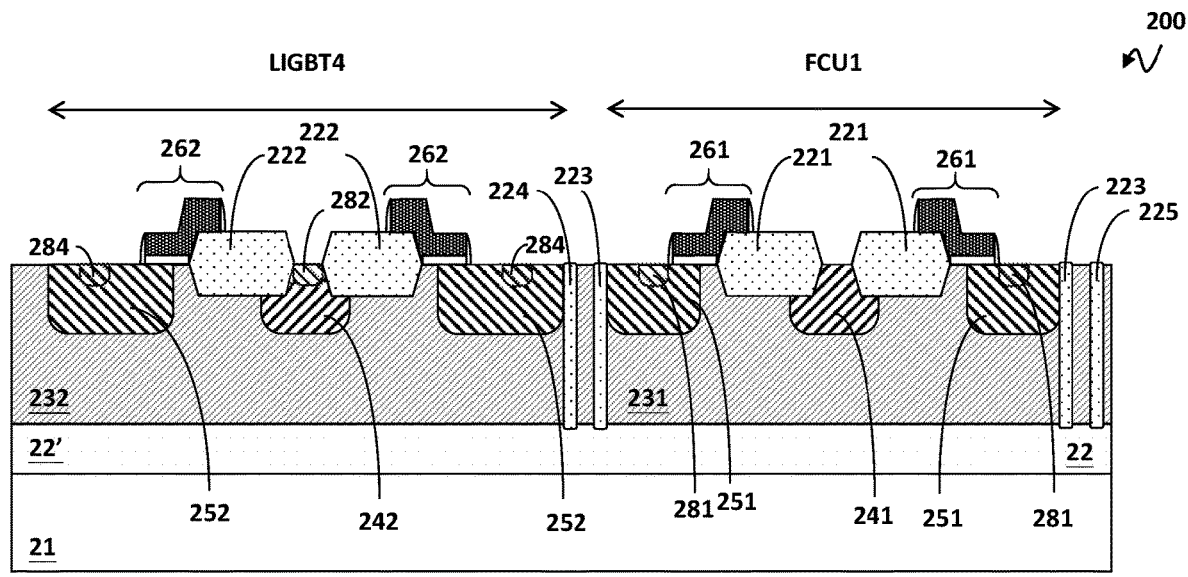
Figure 6N:
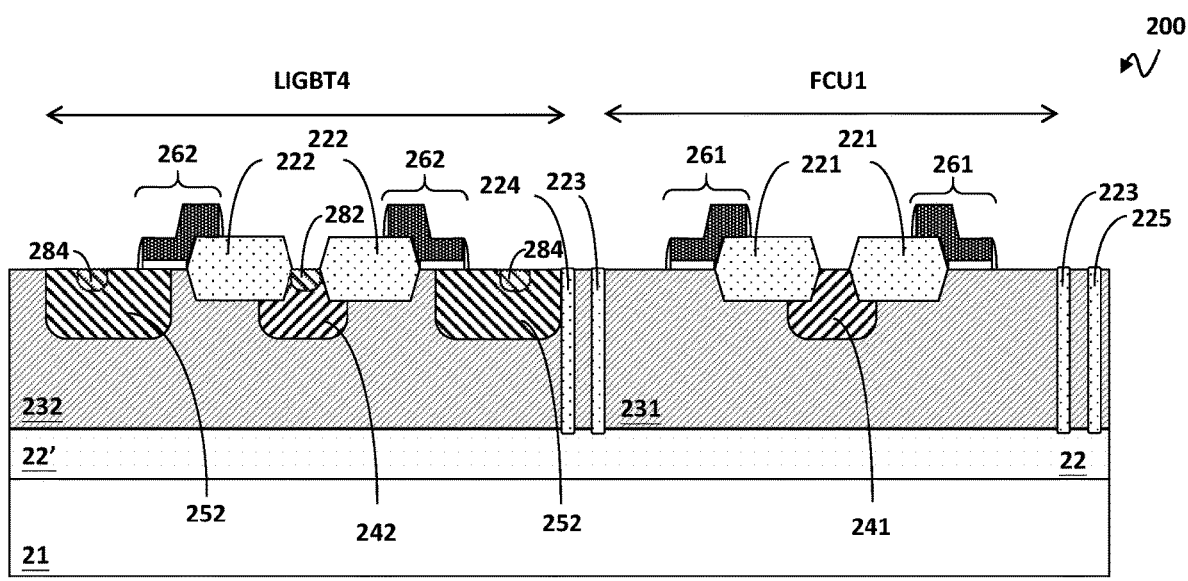
Figure 6O:
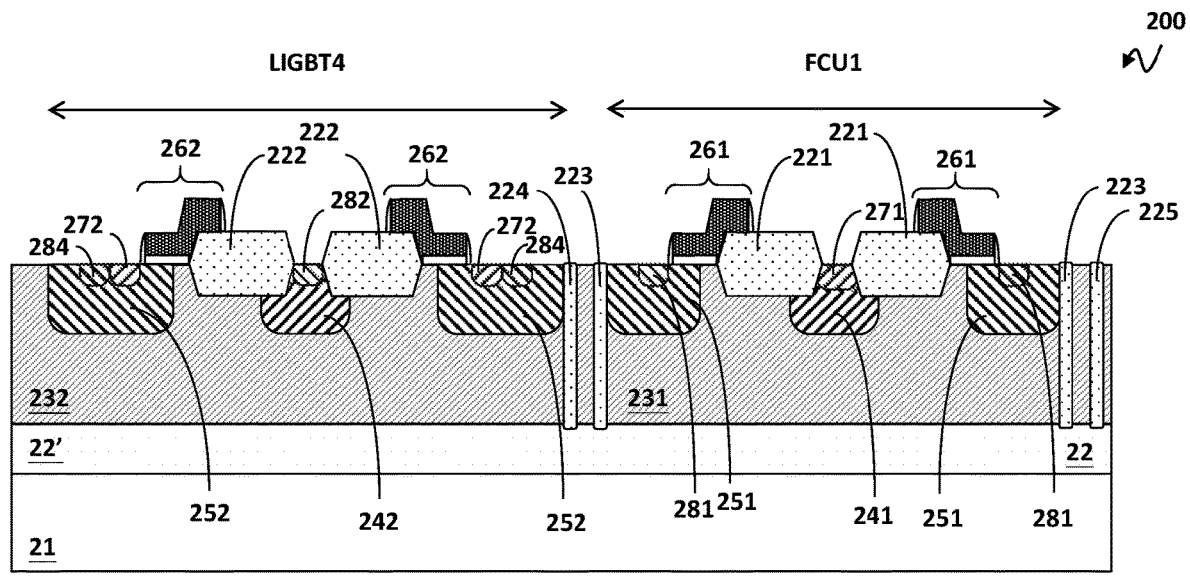
Figure 6P:
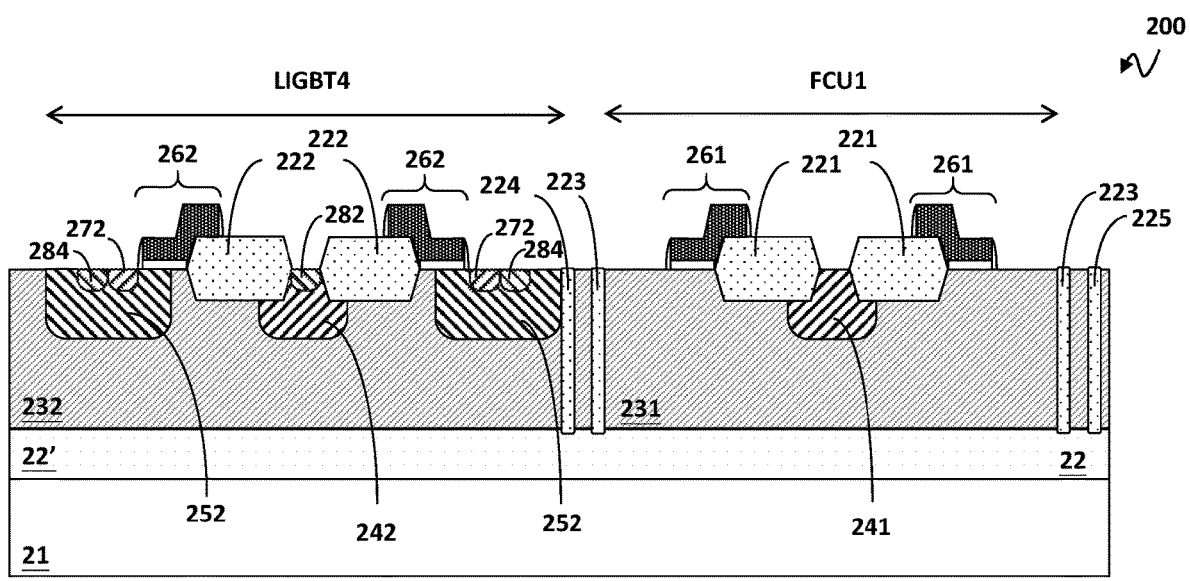
Figure 6Q:
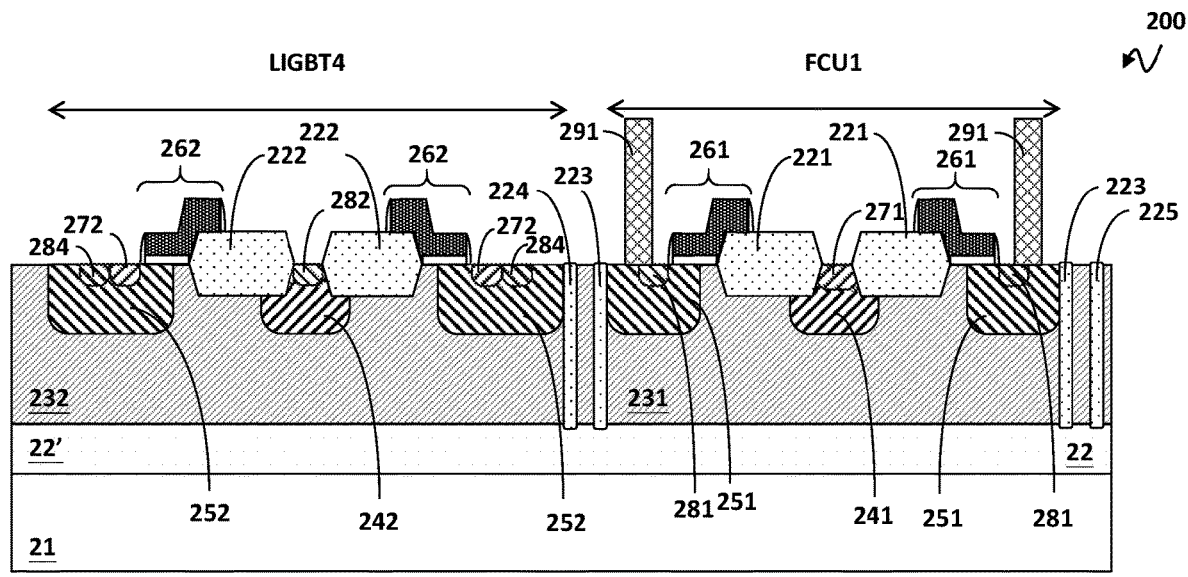
Figure 6R:
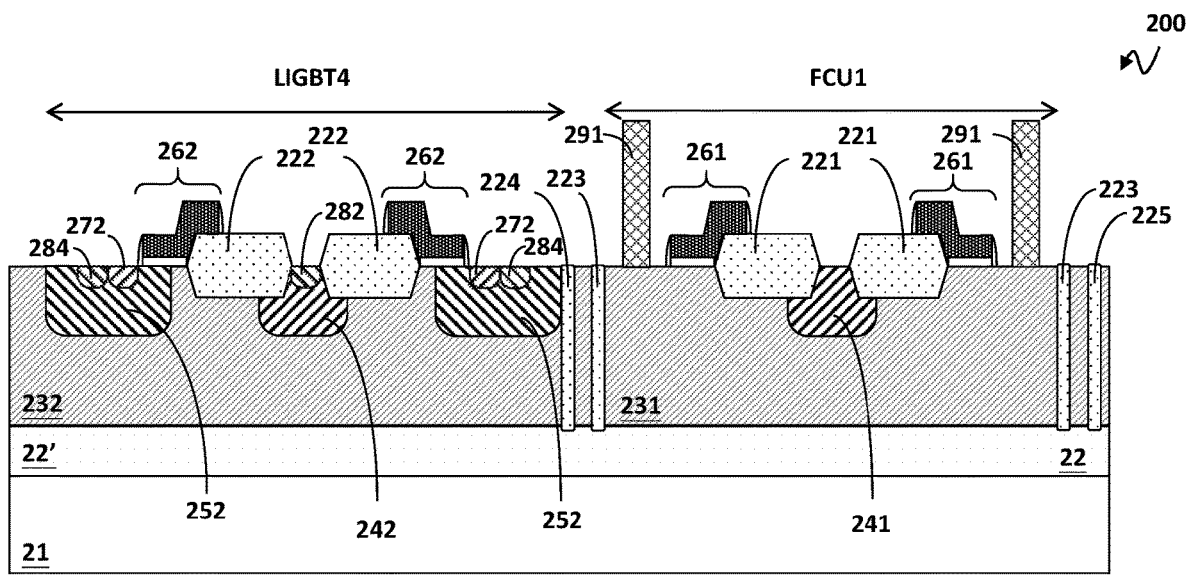

Please refer to FIGS. 6A-6R, which show a manufacturing method of a power device 200 according to an embodiment of the present invention. FIGS. 6A, 6C, 6E, 6G, 6I, 6K, 6M, 6O and 6Q show a cross sectional view of a manufacturing method of the power device 200 as shown in FIG. 2B which is taken along B-B' line of FIG. 2A. FIGS. 6B, 6D, 6F, 6H, 6J, 6L, 6N, 6P and 6R show a cross sectional view of the manufacturing method of the power device 200 as shown in FIG. 2C which is taken along C-C' line of FIG. 2A. As shown in FIG. 6A and FIG. 6B, first, a first insulation bottom layer 22 and a second insulation bottom layer 22' are formed on a semiconductor substrate 21. The semiconductor substrate 21 can be, for example but not limited to, a P-type or an N-type semiconductor silicon substrate. In other embodiments, the semiconductor substrate 21 can be any other semiconductor substrate. A layer of insulating material, such as a silicon dioxide layer, is formed on the semiconductor substrate 21, wherein a part of the silicon dioxide layer can serve as the first insulation bottom layer 22, while, another part of the silicon dioxide layer can serve as the second insulation bottom layer 22'. An N-type epitaxial layer is formed on the silicon dioxide layer, wherein a part of the N-type epitaxial layer can serve as the first N-type region 231, while, another part of the N-type epitaxial layer can serve as the second N-type region 232. The above-mentioned semiconductor substrate 21, silicon dioxide layer and N-type epitaxial layer can be implemented through adopting an silicon on insulator (SOI) wafer, which is well known to those skilled in the art, so the details thereof are not redundantly explained here.

Next, as shown in FIG. 6C and FIG. 6D, the first insulation side wall 223, the second insulation side wall 224 and the third insulation side wall 225 are formed. In this embodiment, they are simultaneously formed via a same deep trench etching process step and a same deposition process step wherein an insulating material such as silicon dioxide is simultaneously deposited into the above-mentioned deep trenches, to form the first insulation side wall 223, the second insulation side wall 224 and the third insulation side wall 225. In addition, the first insulation side wall 223, the second insulation side wall 224 and the third insulation side wall 225 are in contact with the underneath silicon dioxide layer which is in contact with the semiconductor substrate 21, so that the first insulation side wall 223, the second insulation side wall 224 and the third insulation side wall 225 can respectively form a closed region in the epitaxial layer. In one embodiment, the bottom and the side of the forward conductive unit FCU1 are encompassed by a first insulation structure ISO3, whereas, the bottoms and the sides of the LIGBT (LIGBT3) and the LIGBT (LIGBT4) are encompassed by a second insulation structure ISO4.

Next, as shown in FIG. 6E and FIG. 6F, the first N-type extension region 241 and the second N-type extension region 242 are formed in the epitaxial layer on or above the semiconductor substrate 21. To be more specific, the first N-type extension region 241 and the second N-type extension region 242 can be simultaneously defined via, for example but not limited to, a same lithography process step; next, the first N-type extension region 241 and the second N-type extension region 242 can be simultaneously formed by, for example but not limited to, a same ion implantation process step which implants N-type impurities in the regions defined by the above-mentioned lithography process step in the form of accelerated ions, to form the first N-type extension region 241 and the second N-type extension region 242. The first N-type extension region 241 and the second N-type extension region 242 both have N conductivity type. The first N-type extension region 241 and the second N-type extension region 242 are both formed in the above-mentioned N-type epitaxial layer, both under and in contact with the upper surface of the N-type epitaxial layer.

Next, as shown in FIG. 6G and FIG. 6H, the first field oxide region 221 and the second field oxide region 222 are formed. To be more specific, the first field oxide region 221 and the second field oxide region 222 can be simultaneously formed on and in contact with the upper surface of the above-mentioned N-type epitaxial layer via, for example but not limited to, a same oxidation process step. The first field oxide region 221 and the second field oxide region 222 are not limited to the local oxidation of silicon (LOCOS) structure as shown in FIG. 6G and FIG. 6H; for example, it may be a shallow trench isolation (STI) structure instead. Please refer also to FIG. 2A. As shown in FIG. 2A, the first field oxide region 221 and the second field oxide region 222 have closed surrounding configurations from top view, which encompass a part of the first N-type extension region 241 and a part of the second N-type extension region 242, respectively.

Next, as shown in FIG. 6I and FIG. 6J, the first P-type well 251 and the second P-type well 252 are formed. To be more specific, the first P-type well 251 and the second P-type well 252 can be simultaneously defined via, for example but not limited to, a same lithography process step; next, the first P-type well 251 and the second P-type well 252 can be simultaneously formed by, for example but not limited to, a same ion implantation process step which implants P-type impurities in the regions defined by the above-mentioned lithography process step in the form of accelerated ions, to form the first P-type well 251 and the second P-type well 252. The first P-type well 251 and the second P-type well 252 both have P conductivity type. The first P-type well 251 and the second P-type well 252 are both formed in the above-mentioned N-type epitaxial layer, both under and in contact with the upper surface of the N-type epitaxial layer. Please refer also to FIG. 2A. As shown in FIG. 2A, the first P-type well 251 and the second P-type well 252 have closed surrounding configurations from top view, which encompass a part of the first field oxide region 221 and a part of the second field oxide region 222, respectively. As shown in the top view of FIG. 2A (please refer also to the top view of FIG. 3), a side of the first P-type well 251 has a comb-teeth edge. Such comb-teeth edge at the side of the first P-type well 251 and the corresponding complementary comb-teeth edge at the side of the first N-type region 231 together form a PN junction having a staggered comb-teeth interface (as shown by the black thick dashed line in FIG. 3). FIG. 6I which is a cross sectional view of the power device 200 taken along B-B' line of FIG. 2A shows that the B-B' line passes the first P-type well 251. On the other hand, FIG. 6J which is a cross sectional view of the power device 200 taken along C-C' line of FIG. 2A shows that the C-C' line does not pass the first P-type well 251.

Next, as shown in FIG. 6K and FIG. 6L, the first gate 261 and the second gate 262 are formed. Please refer also to FIG. 2A. As shown in FIG. 2A, the first gate 261 and the second gate 262 have closed surrounding configurations from top view of FIG. 2A. The first gate 261 and the second gate 262 can be simultaneously formed on the epitaxial layer via, for example but not limited to, a same gate formation process. The first gate 261 and the second gate 262 can include for example their own respective dielectric layers, conductive layers and spacer layers, which is well known to those skilled in the art, so the details thereof are not redundantly explained here. The above-mentioned gate formation process for example comprises: a lithography process step and an oxidation process step for forming the dielectric layer, a lithography process step and a deposition process step for forming the conductive layer, and a deposition process step and an etching process step for forming the spacer layer.

In this embodiment, the first gate 261 extends on the staggered comb-teeth interface and alternatingly contacts the first N-type region 231 and the first P-type well 251. The first gate 261 is arranged in parallel with the metal line 291 and the first gate 261 does not directly contact the metal line 291.

Next, as shown in FIG. 6M and FIG. 6N, the forward terminal 281, the emitter 282 and the P-type contact electrode 284 are formed. The forward terminal 281, the emitter 282 and the P-type contact electrode 284 can be simultaneously defined via, for example but not limited to, a same lithography process step; next, the forward terminal 281, the emitter 282 and the P-type contact electrode 284 can be simultaneously formed by, for example but not limited to, a same ion implantation process step which implants P-type impurities in the regions defined by the above-mentioned lithography process step in the form of accelerated ions, to form the forward terminal 281, the emitter 282 and the P-type contact electrode 284. The forward terminal 281, the emitter 282 and the P-type contact electrode 284 have P conductivity type. The forward terminal 281, the emitter 282 and the P-type contact electrode 284 are formed in the first P-type well 251, the second N-type extension region 242 and the second P-type well 252, respectively. The forward terminal 281, the emitter 282 and the P-type contact electrode 284 are under and in contact with the upper surface of the N-type epitaxial layer. Please refer also to the top view of FIG. 2A. As shown in FIG. 2A, the forward terminal 281 and the P-type contact electrode 284 have closed surrounding configurations from top view, which encompass the first gate 261 and the drain 272, respectively.

Next, as shown in FIG. 6O and FIG. 6P, the reverse terminal 271 and the drain 272 are formed. To be more specific, the reverse terminal 271 and the drain 272 can be simultaneously defined via, for example but not limited to, a same lithography process step (which includes adopting the second gate 262 as a mask); next, the reverse terminal 271 and the drain 272 can be simultaneously formed by, for example but not limited to, a same ion implantation process step which implants N-type impurities in the regions defined by the above-mentioned lithography process step in the form of accelerated ions, to form the reverse terminal 271 in the first N-type extension region 241 and form the drain 272 in the second N-type extension region 242. The reverse terminal 271 and the drain 272 both have N conductivity type. The reverse terminal 271 and the drain 272 are both formed in the above-mentioned N-type epitaxial layer, both under and in contact with the upper surface of the N-type epitaxial layer. Please refer also to the top view of FIG. 2A. As shown in FIG. 2A, the drain 272 has a closed surrounding configuration from top view, which encompasses the second gate 262.

Next, as shown in FIG. 6Q and FIG. 6R, a metal line 291 is formed. To be more specific, the metal line 291 extends on the staggered comb-teeth interface and alternatingly contacts the first N-type region 231 and the first P-type well 251. In one embodiment, the step for forming the metal line 291 can include, for example but not limited to, a metal deposition process step. In other embodiments, plural metal contacts can be first formed on the first N-type region 231 and the first P-type well 251, wherein the thus formed metal contacts are in contact with the first N-type region 231 and the first P-type well 251; subsequently, a metal wire can be formed on the metal contacts. The process step for forming a metal line is well known to those skilled in the art, so the details thereof are not redundantly explained here.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well region, may be added. For another example, the lithography process step is not limited to the mask technology but it can also include electron beam lithography. Therefore, in the same spirit of the present invention, those skilled in the art can think of various equivalent variations and various combinations, and there are many combinations thereof, and the description will not be repeated here. The scope of the present invention should include what are defined in the claims and the equivalents.

What is claimed is:

1. A power device, which is formed on a semiconductor substrate; the power device comprising:
   a plurality of lateral insulated gate bipolar transistors (LIGBTs) which are connected in parallel to each other; and
   a forward conductive unit, which is connected in parallel to the plurality of LIGBTs, wherein the forward conductive unit consists of a PN diode and a Schottky diode which are connected in parallel to each other;
   wherein the PN diode and the Schottky diode share a first N-type region, a reverse terminal, a first N-type extension region, a first field oxide region, a first gate and a first P-type well;
   wherein the first N-type region, the reverse terminal, the first N-type extension region and the first P-type well are formed in an epitaxial layer on or above the semiconductor substrate;
   wherein the first N-type region and the first P-type well form a PN junction therebetween, wherein the PN junction has a staggered comb-teeth interface from top view;
   wherein a metal line extends right above on the staggered comb-teeth interface and alternatingly contacts the first N-type region and the first P-type well a plurality times.

2. The power device of claim 1, wherein a drain of each LIGBT is electrically connected to a forward terminal of the forward conductive unit, whereas, an emitter of each LIGBT is electrically connected to the reverse terminal of the forward conductive unit.

3. The power device of claim 1, wherein a bottom and a side of the forward conductive unit are encompassed by a first insulation structure, while, bottoms and sides of the plurality of LIGBTs are encompassed by a second insulation structure.

4. The power device of claim 1, wherein each LIGBT includes:
   a second N-type region, which is formed in the epitaxial layer;
   a second P-type well, which is formed in the epitaxial layer;
   an N-type drain, which is formed in the second P-type well;
   a P-type contact electrode, which is formed in the second P-type well, wherein the P-type contact electrode serves as an electrical point of the second P-type well;
   a second gate, which is formed on the epitaxial layer, wherein a part of the second gate is connected on the second P-type well;
   a second N-type extension region, which is formed in the second N-type region, wherein the second N-type extension region and the second P-type well are separated from each other via the second N-type region;
   a P-type emitter, which is formed in the second N-type extension region; and
   a second field oxide region, which is formed on the epitaxial layer, wherein the second field oxide region is located between the emitter and the drain.

5. The power device of claim 4, wherein the first N-type extension region and the second N-type extension region are formed simultaneously via a same lithography process step and a same ion implantation process step;
   wherein the first P-type well and the second P-type well are formed simultaneously via a same lithography process step and a same ion implantation process step;
   wherein the reverse terminal and the emitter are formed simultaneously via a same lithography process step and a same ion implantation process step;
   wherein the first gate and the second gate are formed simultaneously via a same gate formation process;
   wherein the first field oxide region and the second field oxide region are formed simultaneously via a same oxidation process step.

6. The power device of claim 1, wherein the first gate extends on the staggered comb-teeth interface and alternatingly contacts the first N-type region and the first P-type well, wherein the first gate is arranged in parallel with the metal line and the first gate does not directly contact the metal line.

7. The power device of claim 3, wherein the semiconductor substrate is entirely in contact with and covered by an insulation layer, and wherein the epitaxial layer is formed on and in contact with the insulation layer, wherein a part of the insulation layer serves as a first insulation bottom layer of the first insulation structure, whereas, another part of the insulation layer serves as a second insulation bottom layer of the second insulation structure.

8. The power device of claim 4, wherein the epitaxial layer has an N conductivity type, and wherein a part of the epitaxial layer serves as the first N-type region, whereas, another part of the epitaxial layer serves as the second N-type region.

9. The power device of claim 4, wherein the epitaxial layer has a P conductivity type, and wherein the first N-type region and the second N-type region are formed simultaneously via a same lithography process step and a same ion implantation process step.

10. A manufacturing method of a power device, wherein the power device is formed on a semiconductor substrate; the manufacturing method comprising:
    forming a plurality of lateral insulated gate bipolar transistors (LIGBTs) which are connected in parallel to each other; and
    forming a forward conductive unit, which is connected in parallel to the plurality of LIGBTs, wherein the forward conductive unit consists of a PN diode and a Schottky diode which are connected in parallel to each other;
    wherein the PN diode and the Schottky diode share a first N-type region, a reverse terminal, a first N-type extension region, a first field oxide region, a first gate and a first P-type well;
    wherein the first N-type region, the reverse terminal, the first N-type extension region and the first P-type well are formed in an epitaxial layer on or above the semiconductor substrate;
    wherein the first N-type region and the first P-type well form a PN junction therebetween, wherein the PN junction has a staggered comb-teeth interface from top view;
    wherein a metal line extends right above on the staggered comb-teeth interface and alternatingly contacts the first N-type region and the first P-type well a plurality times.

11. The manufacturing method of the power device of claim 10, wherein a drain of each LIGBT is electrically connected to a forward terminal of the forward conductive unit, whereas, an emitter of each LIGBT is electrically connected to the reverse terminal of the forward conductive unit.

12. The manufacturing method of the power device of claim 10, wherein a bottom and a side of the forward conductive unit are encompassed by a first insulation structure, while, bottoms and sides of the plurality of LIGBTs are encompassed by a second insulation structure; and wherein a method for forming the first insulation structure and the second insulation structure includes:
    forming an insulation layer on the semiconductor substrate, wherein the insulation layer is located between and separates the semiconductor substrate and the epitaxial layer, wherein the semiconductor substrate is entirely in contact with and covered by the insulation layer, wherein a part of the insulation layer serves as a first insulation bottom layer of the first insulation structure, whereas, another part of the insulation layer serves as a second insulation bottom layer of the second insulation structure; and
    simultaneously forming a first insulation side wall of the first insulation structure and a second insulation side wall of the second insulation structure in the epitaxial layer via a deep trench etching process step and an oxidation deposition process step.

13. The manufacturing method of the power device of claim 10, wherein a method for forming the LIGBT includes:
    forming a second N-type region in the epitaxial layer;
    forming a second P-type well in the epitaxial layer;
    forming an N-type drain in the second P-type well;
    forming a P-type contact electrode in the second P-type well, wherein the P-type contact electrode serves as an electrical point of the second P-type well;
    forming a second gate on the epitaxial layer, wherein a part of the second gate is connected on the second P-type well;
    forming a second N-type extension region in the second N-type region, wherein the second N-type extension region and the second P-type well are separated from each other via the second N-type region;
    forming a P-type emitter in the second N-type extension region; and
    forming a second field oxide region on the epitaxial layer, wherein the second field oxide region is located between the emitter and the drain.

14. The manufacturing method of the power device of claim 13, wherein the first N-type extension region and the second N-type extension region are formed simultaneously via a same lithography process step and a same ion implantation process step;
    wherein the first P-type well and the second P-type well are formed simultaneously via a same lithography process step and a same ion implantation process step;
    wherein the reverse terminal and the emitter are formed simultaneously via a same lithography process step and a same ion implantation process step;
    wherein the first gate and the second gate are formed simultaneously via a same gate formation process;
    wherein the first field oxide region and the second field oxide region are formed simultaneously via a same oxidation process step.

15. The manufacturing method of the power device of claim 10, wherein the first gate extends on the staggered comb-teeth interface and alternatingly contacts the first N-type region and the first P-type well, wherein the first gate is arranged in parallel with the metal line and the first gate does not directly contact the metal line.

16. The manufacturing method of the power device of claim 13, wherein the epitaxial layer has an N conductivity type, and wherein a part of the epitaxial layer serves as the first N-type region, whereas, another part of the epitaxial layer serves as the second N-type region.

17. The manufacturing method of the power device of claim 13, wherein the epitaxial layer has a P conductivity type, and wherein the first N-type region and the second N-type region are formed simultaneously via a same lithography process step and a same ion implantation process step.

* * * * *